(12) United States Patent
Kang et al.

(10) Patent No.: US 12,733,245 B2
(45) Date of Patent: Sep. 8, 2026

(54) FORKSHEET FIELD EFFECT TRANSISTOR INCLUDING T-SHAPED BACKBONE

(71) Applicant: International Business Machines Corporation, Armonk, NY (US)

(72) Inventors: Tsung-Sheng Kang, Ballston Lake, NY (US); Sagarika Mukesh, Albany, NY (US); Alexander Reznicek, Troy, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 371 days.

(21) Appl. No.: 18/503,322

(22) Filed: Nov. 7, 2023

(65) Prior Publication Data

US 2025/0151373 A1 May 8, 2025

(51) Int. Cl.

| | |
|---|---|
| ***H10D 84/01*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(Continued)

(52) U.S. Cl.

CPC ......... *H10D 84/038* (2025.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/0188* (2025.01); *H10D 84/85* (2025.01)

(58) Field of Classification Search

CPC .... H10D 30/014; H10D 30/031; H10D 30/43; H10D 30/6735; H10D 30/6757; H10D 62/121; H10D 64/017; H10D 84/0167; H10D 84/017; H10D 84/0188; H10D 84/038; H10D 84/85; H10D 62/116

See application file for complete search history.

(56) References Cited

U.S. PATENT DOCUMENTS 6,630,712 B2 * 10/2003 Yu ........................ H10D 64/671 257/E21.205
10,014,390 B1 7/2018 Bouche et al.

(Continued)

FOREIGN PATENT DOCUMENTS

CN 114388442 A * 4/2022 ............. H10D 30/43
WO 2021182247 A1 9/2021

OTHER PUBLICATIONS

Jung, et al., "Performance Analysis on Complementary FET (CFET) Relative to Standard CMOS with Nanosheet FET", IEEE Journal of the Electron Devices Society, 2021, 5 pages.

*Primary Examiner* — Telly D Green
(74) *Attorney, Agent, or Firm* — CANTOR COLBURN LLP; Samuel Waldbaum

(57) ABSTRACT

A semiconductor device includes a first-type transistor, a second-type transistor, and a t-shaped backbone. The first-type transistor includes a first-type source/drain and the second-type transistor includes a second-type source/drain. The t-shaped backbone includes a wall and a sub-wall. The wall separates the first-type transistor and the second-type source/drain. The sub-wall extends from the wall and into the second-type source/drain.

12 Claims, 39 Drawing Sheets

(51) Int. Cl.

| | |
|---|---|
| ***H10D 84/03*** | (2025.01) |
| ***H10D 84/85*** | (2025.01) |

(56) References Cited

U.S. PATENT DOCUMENTS

| | | | | |
|---|---|---|---|---|
| 11,387,322 | B2 | 7/2022 | Wang et al. | |
| 11,515,399 | B2 | 11/2022 | Dentoni Litta et al. | |
| 11,923,370 | B2 * | 3/2024 | Sung | H10D 86/201 |
| 12,243,875 | B2 * | 3/2025 | Sung | H10D 30/6757 |
| 12,414,328 | B2 * | 9/2025 | Zhou | H10D 62/118 |
| 12,538,516 | B2 * | 1/2026 | Neumann | H10D 30/62 |
| 2022/0093647 | A1 * | 3/2022 | Sung | H10D 30/6735 |
| 2022/0093734 | A1 | 3/2022 | Chan et al. | |
| 2022/0102346 | A1 | 3/2022 | Lilak et al. | |
| 2023/0038116 | A1 * | 2/2023 | Xie | H10D 64/017 |
| 2023/0126135 | A1 * | 4/2023 | Neumann | H10D 30/62 257/365 |
| 2023/0290862 | A1 * | 9/2023 | Hall | H10D 30/6757 |
| 2024/0153956 | A1 * | 5/2024 | Sung | H10D 30/014 |
| 2024/0371935 | A1 * | 11/2024 | Tang | H10D 62/822 |
| 2024/0413217 | A1 * | 12/2024 | Tsai | H10D 84/038 |
| 2025/0120183 | A1 * | 4/2025 | Jung | H10D 84/0149 |
| 2025/0126884 | A1 * | 4/2025 | Xie | H10D 84/85 |
| 2025/0142871 | A1 * | 5/2025 | Lee | H10D 30/6219 |
| 2025/0142893 | A1 * | 5/2025 | Chiang | H10D 30/031 |
| 2025/0185363 | A1 * | 6/2025 | Sung | H10D 84/038 |
| 2025/0318220 | A1 * | 10/2025 | Hsu | H10D 62/121 |

* cited by examiner

266
PFET
NFET
260
202a
256
18
16
10
Y2

PFET
268
266
NFET
pFET
epi
202a
256
18
16
10
Y2

100

NFET 20
22
20
22
20
22 Si
20
19
18
Si epi
SiGe etch stop 16
10
Si-sub
X

FORKSHEET FIELD EFFECT TRANSISTOR INCLUDING T-SHAPED BACKBONE

BACKGROUND

The present invention generally relates to fabrication methods and resulting structures for semiconductor devices, and more specifically, to processing methods and resulting structures for providing a forksheet field effect transistor.

In contemporary semiconductor device fabrication processes, a large number of metal oxide semiconductor field effect transistors (MOSFETs), such as n-type field effect transistors (NFETs) and p-type field effect transistors (PFETs), are fabricated on a single wafer. Non-planar MOSFET architectures (e.g., fin-type FETs (FinFETs)) can provide increased device density and increased performance over planar MOSFETs.

A so-called gate-all-around (GAA) nanosheet FET is non-planar architecture that provides a relatively small FET footprint by forming the channel region as a series of thin nanosheets (e.g., about 3 nanometers (nm) to about 8 nm thick). In a known GAA configuration, a nanosheet-based FET includes a source region, a drain region and stacked, spaced-apart nanosheet channels between the source and drain regions. A gate surrounds the stack and each spaced-apart nanosheet channel to regulate electron flow through the nanosheet channels between the source and drain regions.

A forksheet field-effect transistor (FET) is a type of GAA nanosheet FET, which offers further scaling opportunities over traditional finFET and nanosheet architectures. The conventional forksheet FET architecture implements a dielectric forksheet backbone, which allows for reducing the spacing between the NFET and the PFET devices to permit further area scaling.

SUMMARY

According to a non-limiting embodiment, a method for forming a semiconductor device is provided. The method comprises forming a t-shaped backbone in a stack of nanosheets. The t-shaped backbone includes a dielectric wall separating the stack of nanosheets into a first-type nanosheet structure and a second-type nanosheet structure, and includes a sub-wall extending into a second-type source/drain region of the second-type nanosheet structure. The method further includes forming a first source/drain cavity in a first-type source/drain region of the first-type nanosheet structure and a second source/drain cavity in the second-type nanosheet structure, the sub-wall dividing the second source/drain cavity into a first source/drain sub-cavity and a second source/drain sub-cavity. The method further includes, performing a conformal deposition process that completely fills the first source/drain sub-cavity and the second source/drain sub-cavity with a dielectric material without completely filing the first source/drain cavity with the dielectric material. The method further includes removing a first portion of the dielectric material from the first source/drain cavity, forming a first-type source/drain in the first source/drain cavity while a second portion of the dielectric material prevents formation of the first-type source/drain in the second source/drain cavity; and removing the second portion of the dielectric material and forming a second-type source/drain in the first source/drain sub-cavity and the second source/drain sub-cavity.

According to another non-limiting embodiment, a semiconductor device comprises a first-type transistor including a first-type source/drain, a second-type transistor including a second-type source/drain, and a t-shaped backbone. The t-shaped backbone includes a wall separating the first-type transistor and the second-type source/drain, and includes a sub-wall extending from the wall and into the second-type source/drain.

According to yet another non-limiting embodiment, A method of forming a forksheet field effect transistor (FET) is provided. The method comprises forming a stack of nanosheets on a substrate, and forming a t-shaped backbone including a wall and a sub-wall extending from the wall. The wall separates the stack of nanosheets into a first-type nanosheet structure and a second-type nanosheet structure. The method further includes patterning the first-type nanosheet structure to form at least two first-type nanosheet fins separated from one another by a first source/drain, and patterning the second-type nanosheet structure to form at least two second-type nanosheet fins separated from one another by a second-type source/drain. The method further includes forming a first gate and a second gate that wrap around the at least two first-type nanosheet fins, respectively, to form a first-type transistor, and forming a third gate and a fourth gate that wrap around the at least two second-type nanosheet fins, respectively, to form a second-type transistor. The sub-wall extends into the second-type source/drain.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1A:
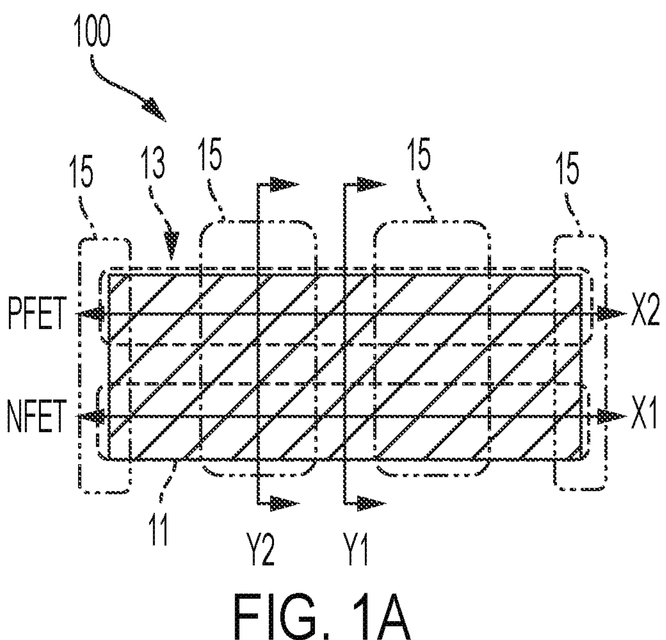
FIG. 1A depicts a top-down reference view of a semiconductor wafer after an initial set of fabrication operations have been applied as part of a method of fabricating a final semiconductor device according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, semiconductor devices (e.g., FETs) are formed using active regions of a wafer. The active regions are defined by isolation regions used to separate and electrically isolate adjacent semiconductor devices. For example, in an IC having a plurality of MOSFETs, each MOSFET has a source and a drain that are formed in an active region of a semiconductor layer by implanting n-type or p-type impurities in the layer of semiconductor material. Disposed between the source and the drain is a channel region. Disposed above the channel region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is controlled in the channel region by a voltage applied at the gate electrode.

As discussed above, a gate-all-around (GAA) nanosheet FET is a known architecture for providing a relatively small FET footprint by forming the channel region as a series of thin nanosheets (e.g., about 3 nm to about 8 nm thick). In a known GAA configuration, a nanosheet-based FET includes a source region, a drain region and stacked, spaced-apart nanosheet channels between the source and drain regions. A gate surrounds the stacked, spaced-apart nanosheet channels and regulates electron flow through the nanosheet channels between the source and drain regions.

GAA nanosheet FETs are fabricated by forming alternating layers of non-sacrificial nanosheets and sacrificial nanosheets. The sacrificial nanosheets are released from the non-sacrificial nanosheets before the FET device is finalized. For n-type FETs, the non-sacrificial nanosheets are typically silicon (Si) and the sacrificial nanosheets are typically silicon germanium (SiGe). For p-type FETs, the non-sacrificial nanosheets can be SiGe and the sacrificial nanosheets can be Si. In some implementations, the non-sacrificial nanosheet of a p-type FET can be SiGe or Si, and the sacrificial nanosheets can be Si or SiGe. Forming the GAA nanosheets from alternating layers of non-sacrificial nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior non-sacrificial electrostatics control, which is necessary for continuously scaling gate lengths down to seven (7) nanometer CMOS technology and below. The use of multiple layered SiGe/Si sacrificial/non-sacrificial nanosheets (or Si/SiGe sacrificial/non-sacrificial nanosheets) to form the channel regions in GAA FET semiconductor devices provides desirable device characteristics, including the introduction of strain at the interface between SiGe and Si.

To further improve device density, a type of GAA transistor architecture referred to as a forksheet FET has been developed. Forksheet FETs implement a set of stacked, spaced-apart nanosheets, which is divided by a dielectric wall (also referred to as a dielectric "backbone"). The dielectric backbone separates the stack into an NFET side and a PFET side integrated in the same structure. In this manner, the forksheet FET is different from existing GAA nanosheet FET architectures which fabricate the NFETs and PFETs as separate devices. Forksheet FETs enable tighter N-to-P (or N2P) spacing and reductions in area scaling. A conventional forksheet FET can achieve, for example, a 42 nm contacted gate pitch (CPP), along with a 16 nm metal pitch. In comparison, a conventional GAA nanosheet FET can achieve, for example, a 45 nm CPP and a 30 nm metal pitch.

Although the relatively close N2P spacing of forksheet FETs provides benefits, close N2P spacing also results in correspondingly smaller patterning process margins when fabricating a forksheet FET. For example, a first lithography mask is typically formed and patterned to protect the NFET region while performing the epitaxy process to form the PFET source/drain. The first lithography mask is then removed and a second lithography mask is formed to cover the PFET region while performing the epitaxy process to form the NFET source/drain. However, the smaller patterning process margins reduces the width of the dielectric backbone making it difficult to accurately pattern the lithography mask used to protect one source/drain region while performing the epitaxy process to form the other source/drain region. For instance, any slight misalignment may cause under-masking in the NFET region which results in inadvertent growth of the p-type epi material in the NFET region. The misalignment may also result in over-masking into PFET region which inadvertently blocks an amount of p-type material growth in the PFET region.

Turning now to an overview of aspects of the invention, various non-limiting embodiments provide fabrication methods and resulting structures for a semiconductor device including a forksheet (or integrated) field effect transistor that employs a t-shaped backbone. The t-shaped backbone includes a dielectric wall (N2P dielectric wall) separating the NFET region from the PFET region (N2P region) with one or more sub-walls extending perpendicular (or substantially perpendicular) to the dielectric wall through the source/drain region of the NFET region or through the source/drain region of an PFET region.

The above-described embodiments of the invention provide technical benefits and technical effects. For example, a given sub-wall divides the source/drain region into two source/drain sub-regions. A conformal dielectric liner can be deposited and selectively removed from the source/drain region that excludes the sub-wall. The reduced widths of the source/drain sub-regions, however, causes the dielectric liner deposited in the sub-regions to "pinch-off". The pinched-off dielectric liner can effectively serve as a source/drain mask that can protect the source/drain sub-regions when performing the epitaxy process to grow the source/drain in the opposing source/drain region (i.e., the source/drain region excluding the sub-wall). Accordingly, the traditional lithography mask and patterning process can be omitted, thereby eliminating the lithography mask misalignment issues realized when reducing the width of the N2P dielectric wall.

A more detailed description of the fabrication operations and resulting structures according to aspects of the present invention will now be discussed with reference to the drawings. FIG. 1A depicts a top-down reference view of an intermediate semiconductor device 100 following an initial set of fabrication operations have been applied as part of a method of fabricating a final semiconductor device according to one or more embodiments of the invention. Additional fabrication operations will be performed as described herein to form a completed forksheet FET including a t-shaped backbone according to one or more non-limiting embodiments of the present invention. As described herein, the t-shaped backbone includes a dielectric wall separating the NFET region from the PFET region with one or more sub-walls extending perpendicular (or substantially perpendicular) to the dielectric wall through the source/drain region of an NFET region or through the source/drain region of an PFET region.

The top-down reference view in FIG. 1A indicates an NFET region 11, a PFET region 13, and one or more source/drain regions 15. The NFET region 11 is designated to receive one or more active channels corresponding to one or more NFETs of a final semiconductor device 100. Likewise, the PFET region 13 is designated to receive one or more channels corresponding to one or more PFETs of the final semiconductor device 100. The source/drain regions 15 are designated to receive a source/drain for a respective NFET or PFET. Although not indicated in FIG. 1A, it should be appreciated that the regions located between a pair of source/drain regions can be designated at gate regions for receiving a gate structure corresponding to respective NFET or PFET.

Figure 1B:
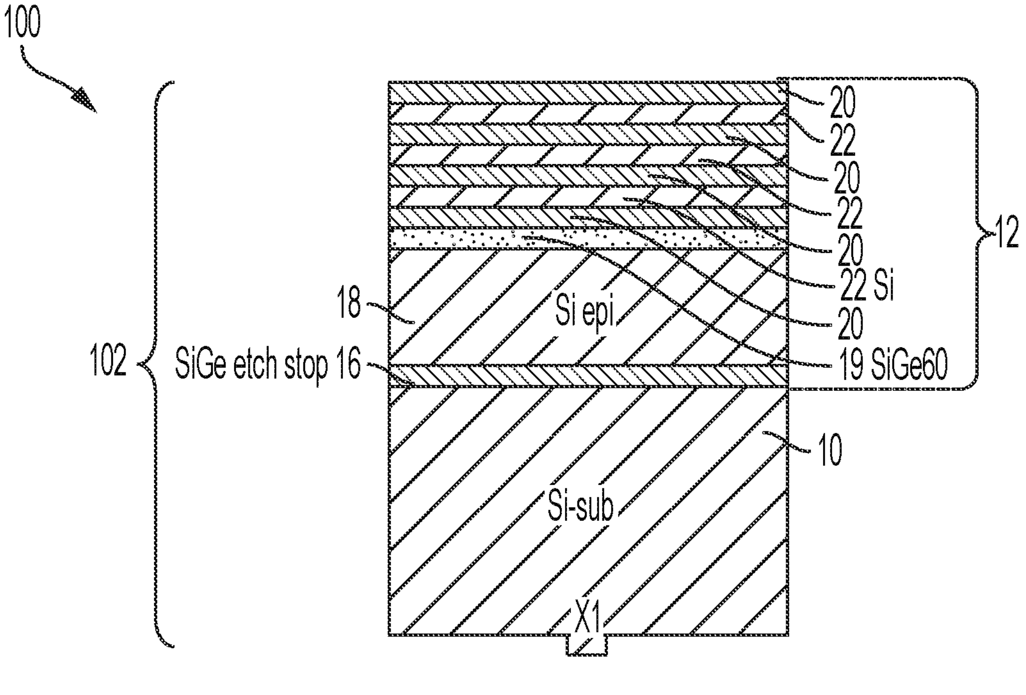
FIG. 1B depicts a cross-sectional view of the semiconductor device taken along the cross-section line X1 shown in FIG. 1A after the initial set of processing operations according to one or more embodiments of the invention.
Figure 1C:
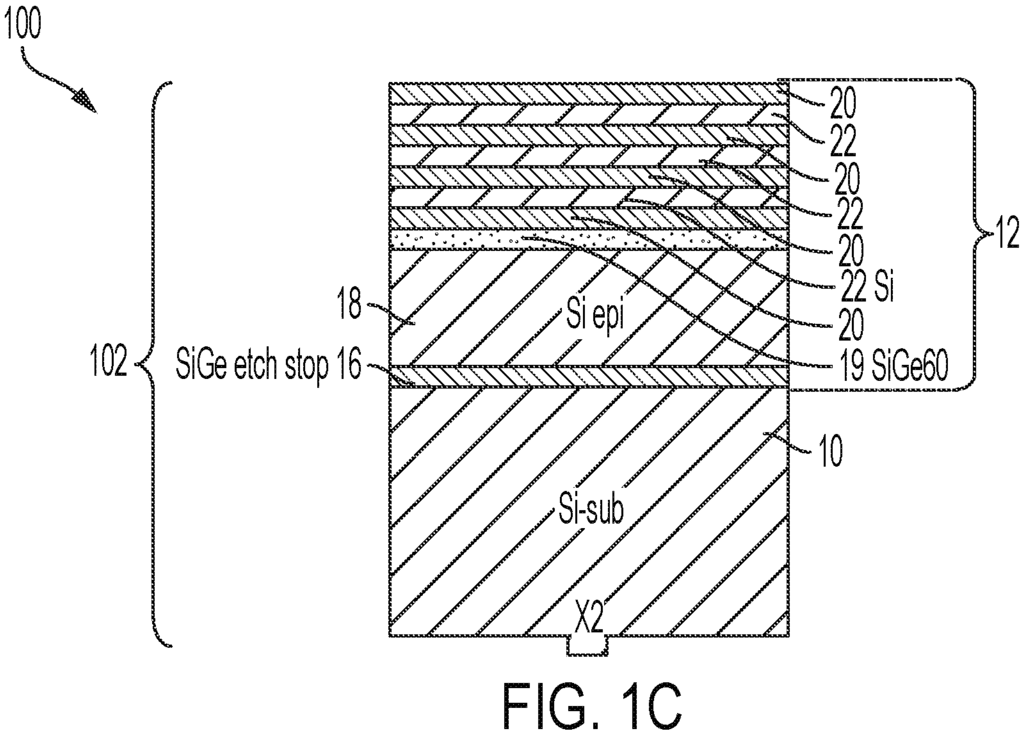
FIG. 1C depicts a cross-sectional of the semiconductor device view taken along cross-section line X2 in FIG. 1A after the initial set of processing operations according to one or more embodiments of the invention.
Figure 1D:
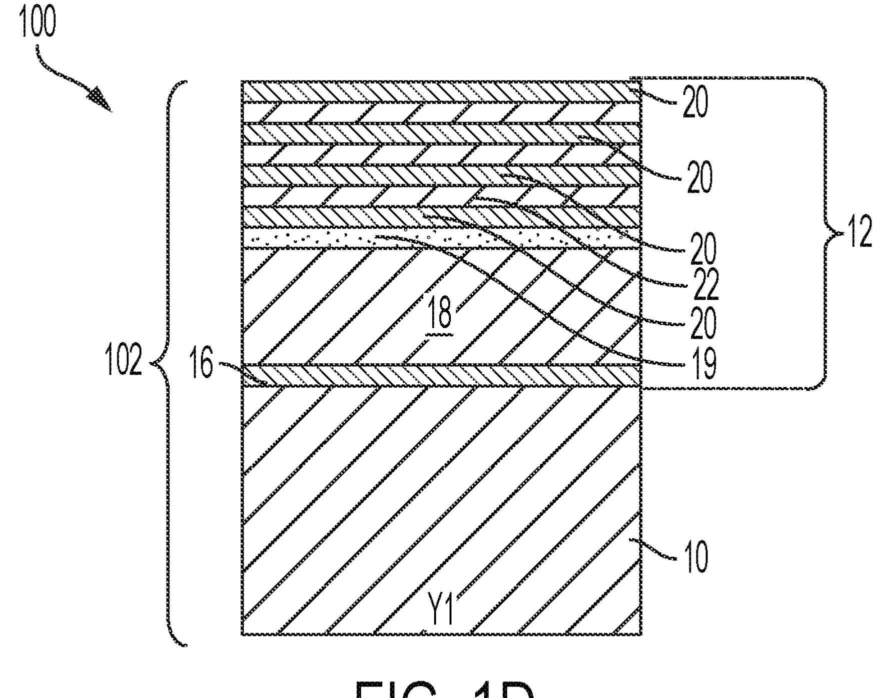
FIG. 1D depicts a cross-sectional view of the semiconductor device taken along the cross-section line Y1 shown in FIG. 1A after the initial set of processing operations according to one or more embodiments of the invention.
Figure 1E:
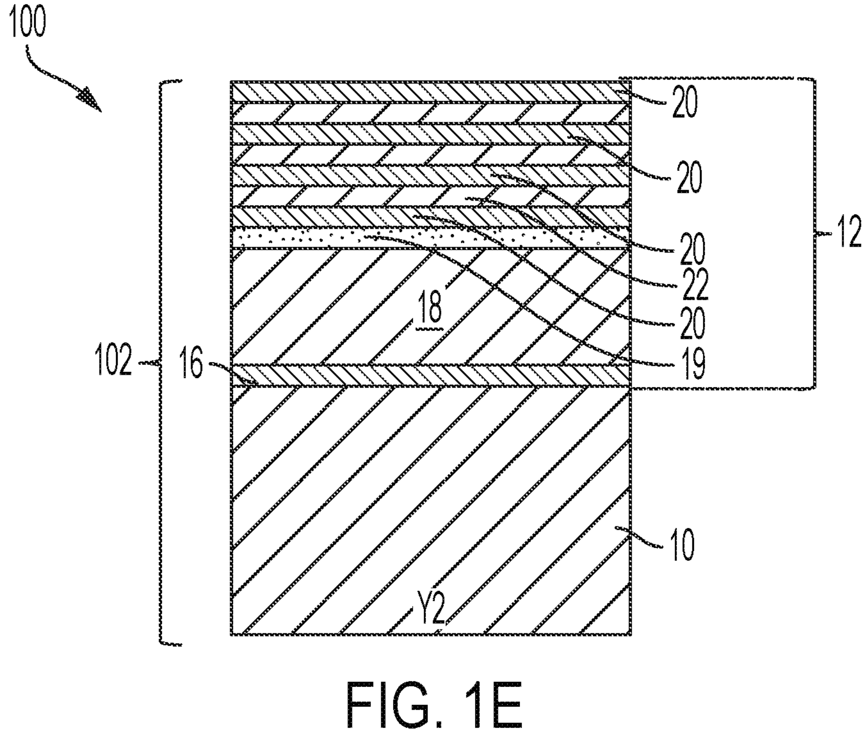
FIG. 1E depicts a cross-sectional of the semiconductor device view taken along cross-section line Y2 in FIG. 1A after the initial set of processing operations according to one or more embodiments of the invention.
Figure 2A:
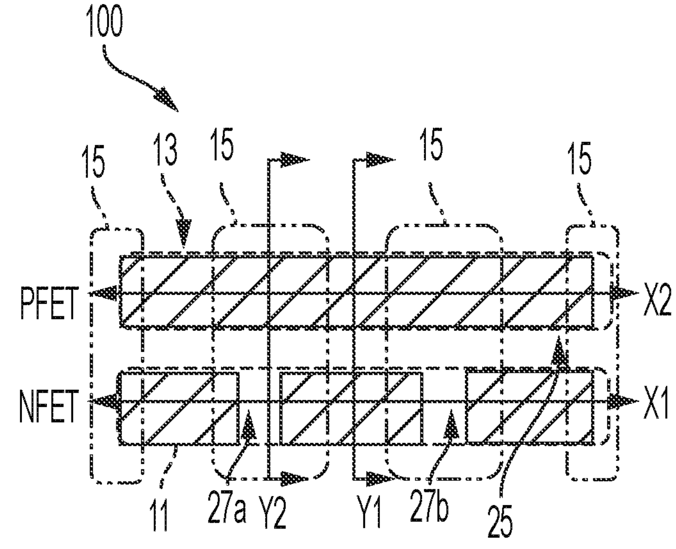
FIG. 2A depicts the top-down reference view of the semiconductor wafer after a processing operation according to one or more embodiments of the invention according to one or more embodiments of the invention.
Figure 2B:
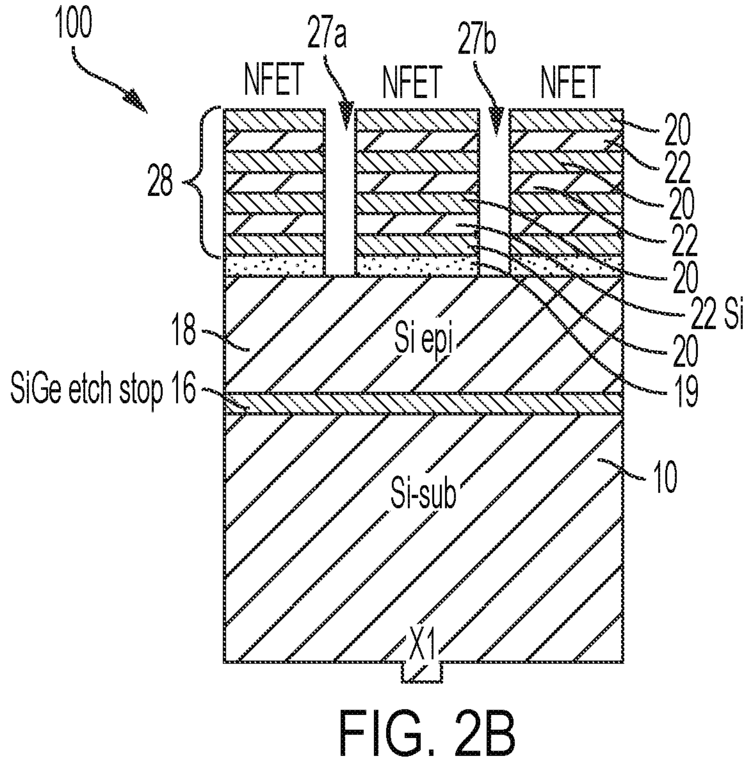
FIG. 2B depicts the cross-sectional view taken along the line X1 of the semiconductor shown in FIG. 2A after the processing operation according to one or more embodiments of the invention.
Figure 2C:
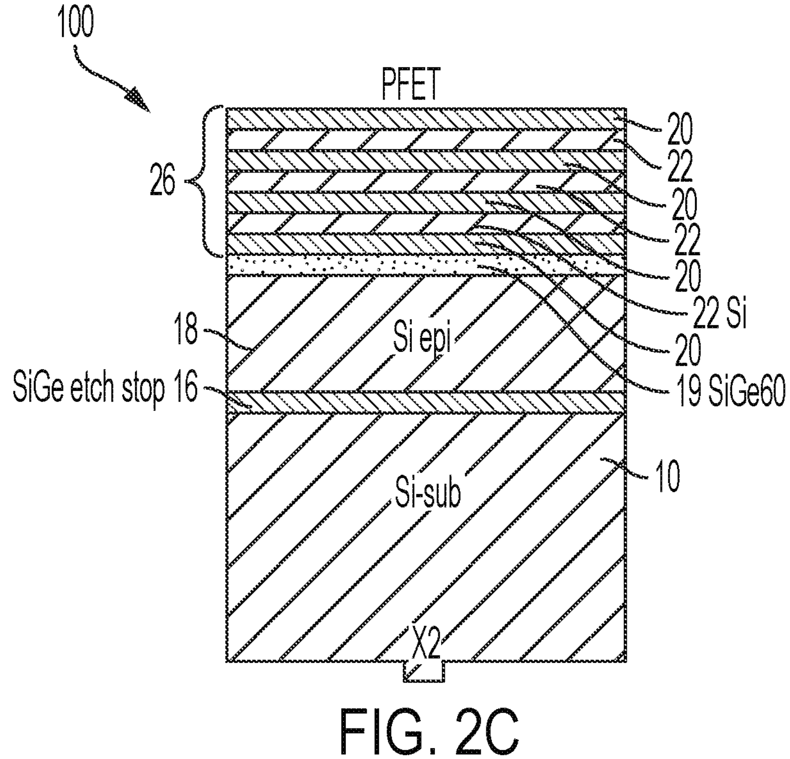
FIG. 2C depicts the cross-sectional view taken along the line X2 of the semiconductor shown in FIG. 2A after the processing operation according to one or more embodiments of the invention.
Figure 2D:
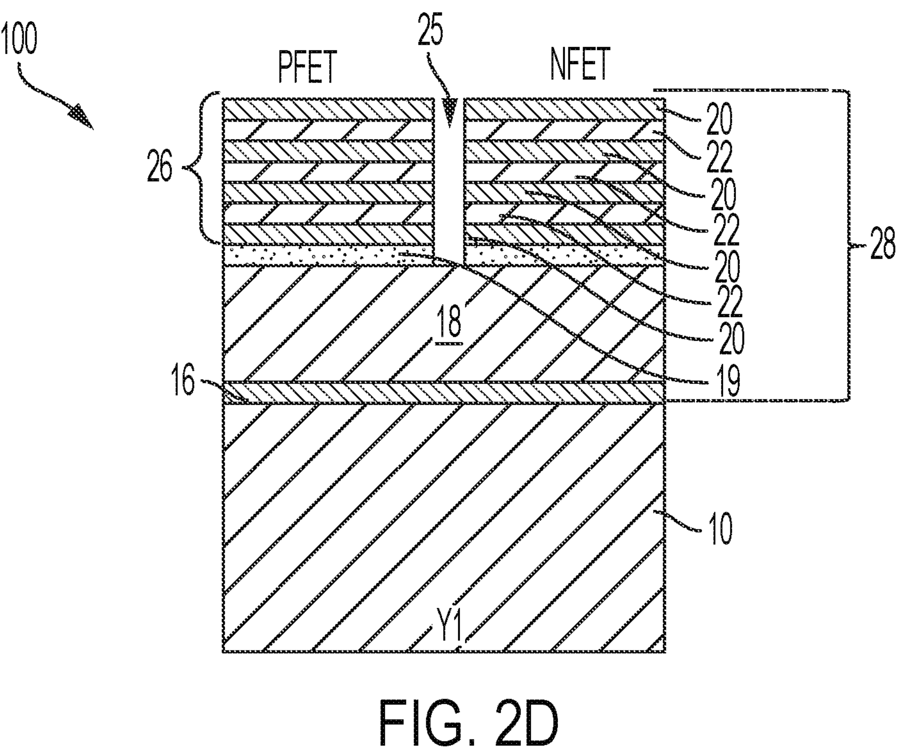
FIG. 2D depicts the cross-sectional view taken along the line Y1 of the semiconductor shown in FIG. 2A after the processing operation according to one or more embodiments of the invention.
Figure 2E:
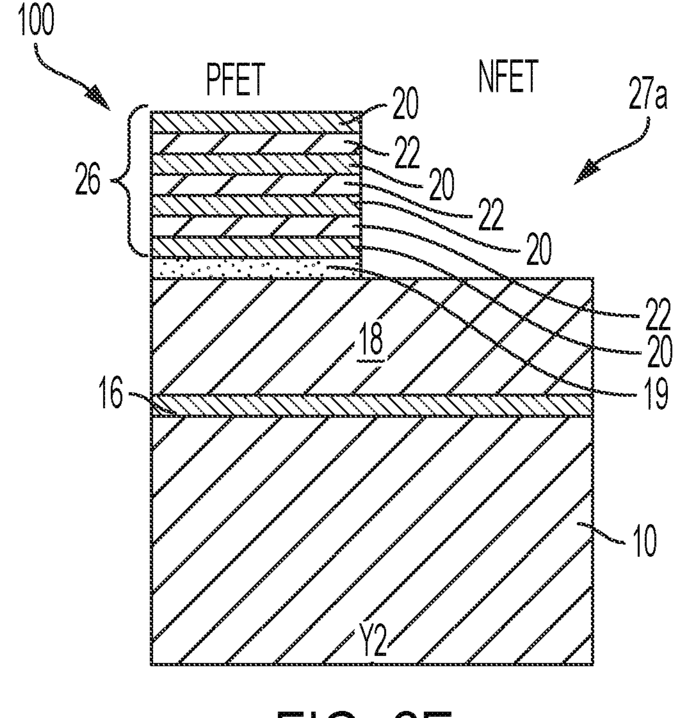
FIG. 2E depicts the cross-sectional view taken along the line Y2 of the semiconductor shown in FIG. 2A after the processing operation according to one or more embodiments of the invention.

FIG. 1B depicts a cross-sectional view of the semiconductor device 100 taken along the cross-section line X1 (e.g., through the channel region of the NFET region 11) shown in FIG. 1A. FIG. 1C depicts a cross-sectional view of the semiconductor device 100 taken along the cross-section line X2 (e.g., through the channel region of the PFET region 13) shown in FIG. 1A. FIG. 1D depicts a cross-sectional view of the semiconductor device 100 taken along the cross-section line Y1 (e.g., across a gate region) shown in FIG. 1A. FIG. 1E depicts a cross-sectional view of the semiconductor device 100 taken along the cross-section line Y2 (e.g., across a source/drain region 15) shown in FIG. 1A.

Referring to FIGS. 1A through 1E, various front-end-of-line (FEOL) structures 102 are built to form the semiconductor device 100 in an intermediate stage of fabrication prior to completing fabrication of the semiconductor device. The FEOL structures 102 include a substrate 10 and a semiconductor stack 12 (e.g., a stack of semiconductor nanosheets) formed on top of the substrate 10. The substrate 10 can be formed from a semiconductor material such as, for example silicon (Si). The semiconductor stack 12 includes a first sacrificial layer 16, a semiconductor layer 18, a second sacrificial layer 19, and alternating nanosheets of a sacrificial material 20 and an active semiconductor material 22. The first sacrificial layer 16 can be, for example, a sacrificial low-Ge % SiGe such as, for example, SiGe30%. The first sacrificial layer 16 serves as an etch stop when removing the substrate 10 in subsequent fabrication operations. In some non-limiting embodiments of the present invention, the first sacrificial layer 16 can be a buried layer of SiO2 when employing a silicon on insulator (SOI) substrate.

The semiconductor layer 18 is deposited on the first sacrificial layer 16. The semiconductor layer 18 can be formed, for example, as a layer of Si that is epitaxially grown from the upper surface of the first sacrificial layer 16. The second sacrificial layer 19 is formed on the upper surface of the semiconductor layer 18. In some embodiments of the invention, the second sacrificial layer 19 is SiGe having a Ge percentage that is sufficiently different from the Ge percentage in the sacrificial nanosheets 20 and an active semiconductor nanosheets 22 that the second sacrificial layer 19 can be selectively removed without also removing the sacrificial nanosheets 20 and an active semiconductor nanosheets 22. In some embodiments of the invention, the second sacrificial layer 19 can be SiGe60%, and the sacrificial nanosheets 20 and an active semiconductor nanosheets 22 can be SiGe30%. The notation "SiGe60%", for example, is used to indicate that 60% of the SiGe material is Ge and 40% of the SiGe material is Si. In some embodiments of the invention, the Ge percentage in the second sacrificial layer 19 can range from about 50% to about 70%. In some embodiments of the invention, the Ge percentage in the sacrificial nanosheets 20 and an active semiconductor nanosheets 22 can range from about 20% to about 45% as long as the necessary etch selectivity between the second sacrificial layer 19 and the sacrificial nanosheets 20 and an active semiconductor nanosheets 22 is established.

The alternating nanosheets of the second sacrificial material 20 and the active semiconductor material 22 are stacked on top of the second sacrificial layer 19. The nanosheets of second sacrificial material 20 (also referred to herein as the sacrificial nanosheets 20) can be formed from a sacrificial material such as, for example, SiGe. The nanosheets of the active semiconductor material 22 (also referred herein as the active semiconductor nanosheets 22) can be formed from silicon (Si), for example, and can serve as the nanosheets that make up the semiconductor channel for the semiconductor device 100.

Turning now to FIGS. 2A through 2E, the semiconductor device 100 is illustrated after forming a t-shaped trench that extends through the sacrificial nanosheets 20, the active semiconductor nanosheets 22, and the second sacrificial layer 19. The t-shaped trench includes a wall trench 25 extending through the N-to-P region (see FIGS. 2A and 2D) and one or more sub-wall trenches 27*a* and 27 (see FIGS. 2B and 2E). The wall trench 25 is formed in an N-to-P region to produce an alternating stack of sacrificial nanosheets 20 and semiconductor nanosheets 22 in the NFET region 11 and an alternating stack of sacrificial nanosheets 20 and active semiconductor nanosheets 22 in the PFET region 13. The width of the wall trench 25 can be, for example, about 10 nm or less. According to a non-limiting embodiment of the present invention, the alternating stack of sacrificial nanosheets 20 and active semiconductor nanosheets 22 in the PFET region 13 defines a single PFET nanosheet structure 26.

The sub-wall trenches 27*a* and 27*b* extend perpendicular (or substantially perpendicular) from the wall trench 25 and separate the alternating stack of sacrificial nanosheets 20 and semiconductor nanosheets 22 into a plurality of individual NFET nanosheet structures 28. The width of the sub-wall trenches 27*a* and 27*b* can be, for example, about 10 nm or less. Although two sub-wall trenches 27*a* and 27*b* are illustrated, it should be appreciated that more or less sub-wall trenches can be formed without departing from the scope of the invention. In addition, although the sub-wall trenches 27*a* and 27*b* are shown extending through the source/drain region 15 in the NFET region 11 (i.e., through the N-to-N region), it should be appreciated that in other embodiments of the invention the sub-wall trenches 27*a* and 27*b* can extend through the source/drain region 15 in the PFET region 13 (i.e., through the P-to-P region).

Referring to FIGS. 3A through 3E, the semiconductor device 100 is illustrated after forming a t-shaped backbone. The t-shaped backbone is formed by filling the wall trench 25 and sub-wall trenches 27*a* and 27*b* with a dielectric material. In one or more embodiments, the t-shaped backbone can be formed by overfilling the wall trench 25 and sub-wall trenches 27*a* and 27*b* with a dielectric material such as silicon dioxide (SiO2), for example, and then performing an etch back operation that stops on the upper surface of the uppermost sacrificial nanosheet 20. Accordingly, the t-shaped backbone is formed with a dielectric wall 200 and sub-walls 202*a* and 202*b*. Although the sub-walls 202*a* and 202*b* are formed as dielectric sub-walls 202*a* and 202*b* as shown in FIGS. 3A through 3E, in some embodiments of the present invention the sub-walls can be formed as semiconductor sub-walls as described in greater detail below.

Figure 3A:
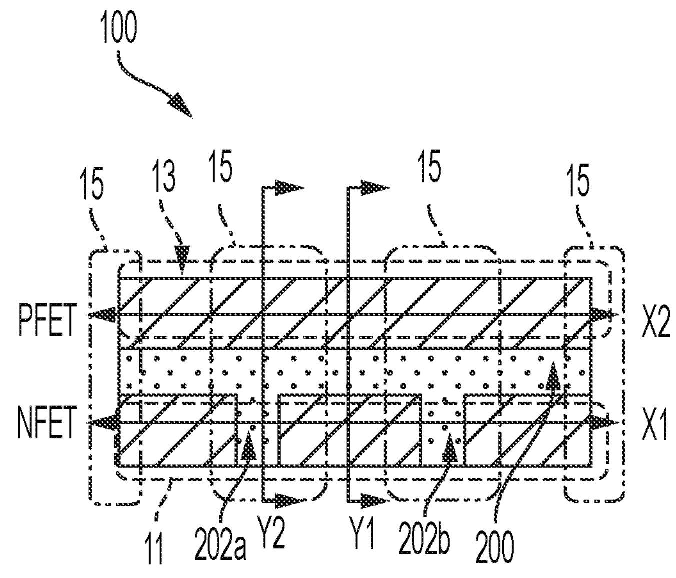
FIG. 3A depicts the top-down reference view of the semiconductor wafer after a processing operation according to one or more embodiments of the invention according to one or more embodiments of the invention.
Figure 3B:
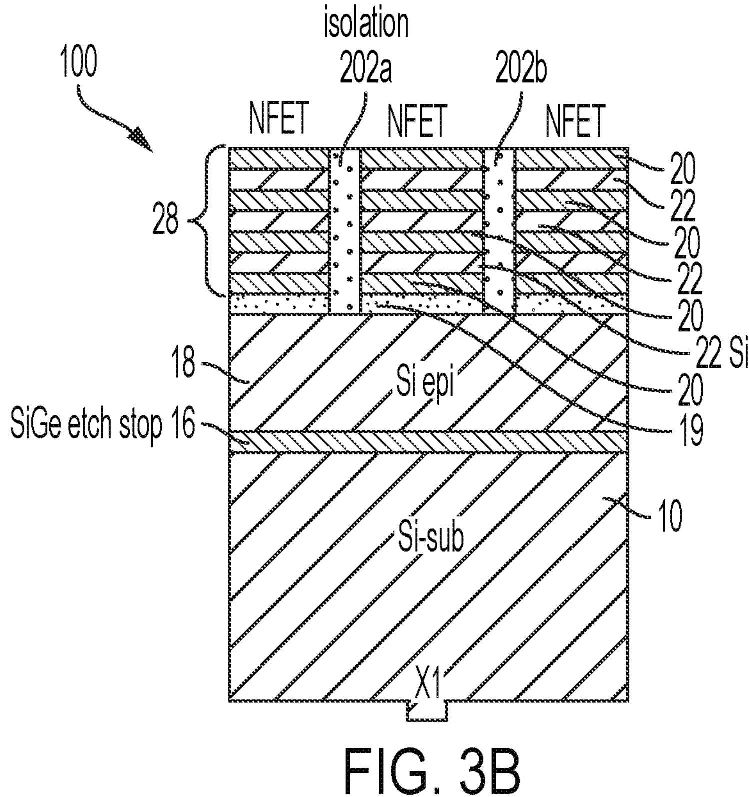
FIG. 3B depicts the cross-sectional view taken along the line X1 of the semiconductor shown in FIG. 3A after the processing operation according to one or more embodiments of the invention.
Figure 3C:
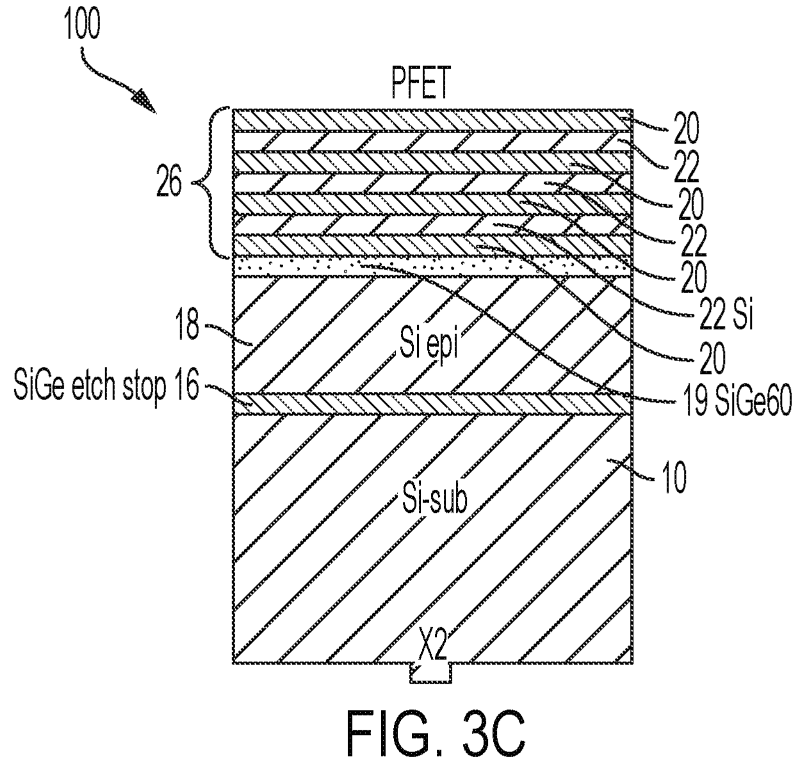
FIG. 3C depicts the cross-sectional view taken along the line X2 of the semiconductor shown in FIG. 3A after the processing operation according to one or more embodiments of the invention.
Figure 3D:
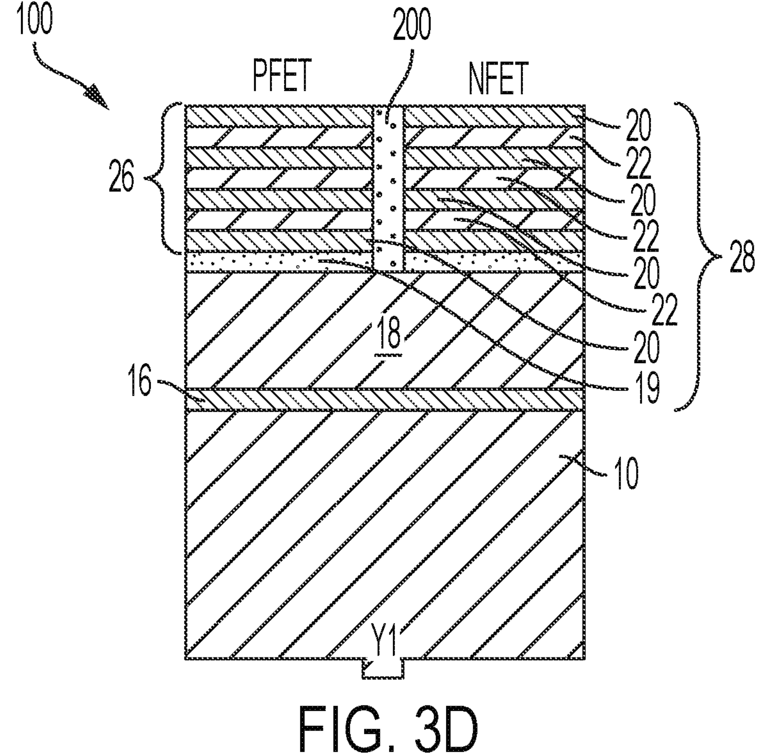
FIG. 3D depicts the cross-sectional view taken along the line Y1 of the semiconductor shown in FIG. 3A after the processing operation according to one or more embodiments of the invention.
Figure 3E:
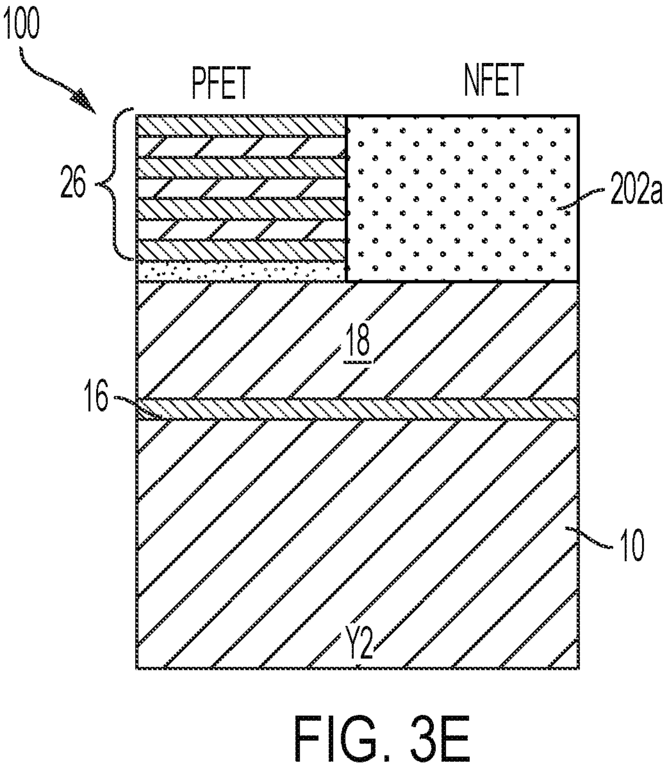
FIG. 3E depicts the cross-sectional view taken along the line Y2 of the semiconductor shown in FIG. 3A after the processing operation according to one or more embodiments of the invention.

As further shown in FIGS. 3A and 3B, for example, the dielectric sub-walls 202*a* and 202*b* are formed between designated source/drain regions 15 of neighboring NFET regions 11. The dielectric wall 200 is formed in the N-to-P region and will serve to assist in isolating (i.e., electrically insulating) the PFET nanosheet structure 26 from the NFET nanosheet structures 28. The dielectric sub-walls 202*a* and 202*b* will serve to assist in isolating (i.e., electrically insulating) the individual NFET nanosheet structures 28 from one another.

Turning to FIGS. 4A through 4E, the semiconductor structure 100 is illustrated after performing known fabrication operations to form sacrificial gates 250, configured and arranged as shown. In one or more embodiments of the invention, each sacrificial gate 250 represents a combination of a thin layer of gate oxide such as SiO2, for example (not shown) and a sacrificial gate material such as amorphous silicon (a-Si), for example. A hardmask layer (e.g., silicon nitride (SiN)) can be deposited on an upper surface of the sacrificial gates 250, patterned, and etched to form individual hardmasks 252. In some embodiments of the invention, the sacrificial gate material can be polycrystalline Si.

Figure 4A:
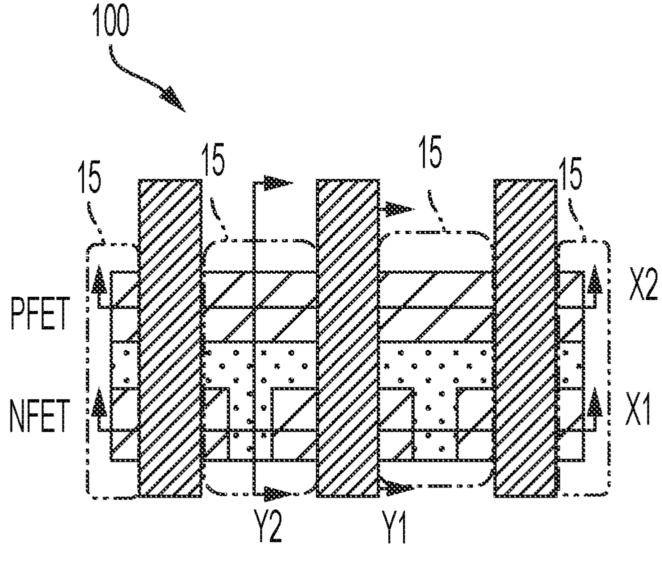
FIG. 4A depicts the top-down reference view of the semiconductor wafer after a processing operation according to one or more embodiments of the invention according to one or more embodiments of the invention.
Figure 4B:
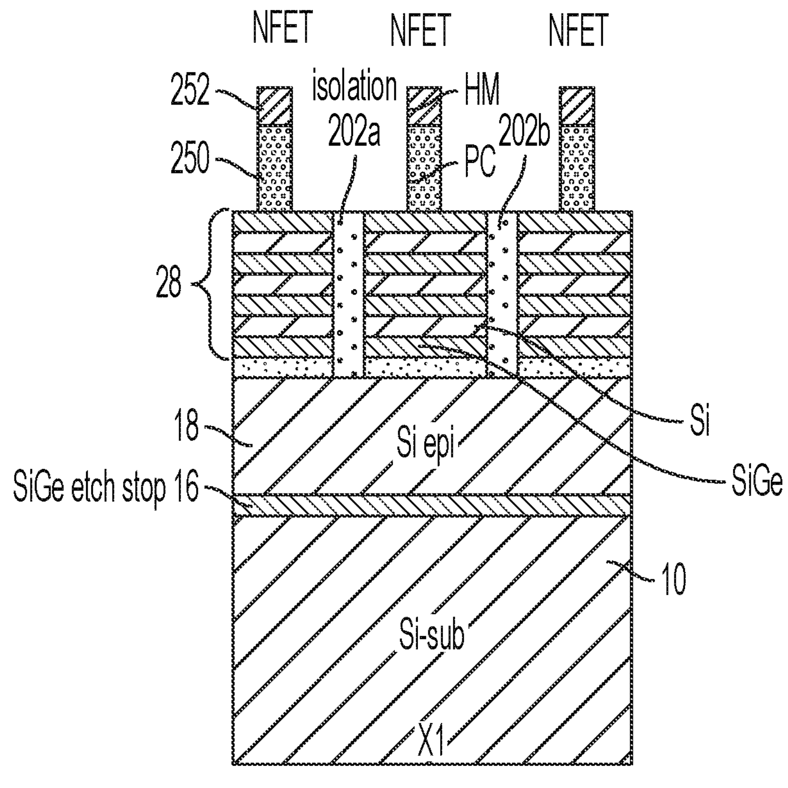
FIG. 4B depicts the cross-sectional view taken along the line X1 of the semiconductor shown in FIG. 4A after the processing operation according to one or more embodiments of the invention.
Figure 4C:
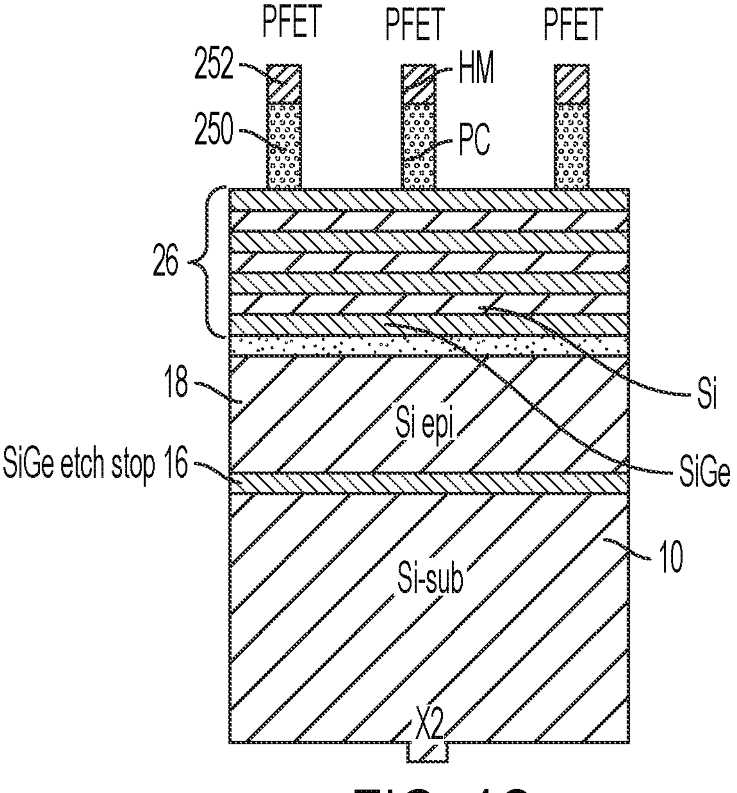
FIG. 4C depicts the cross-sectional view taken along the line X2 of the semiconductor shown in FIG. 4A after the processing operation according to one or more embodiments of the invention.
Figure 4D:
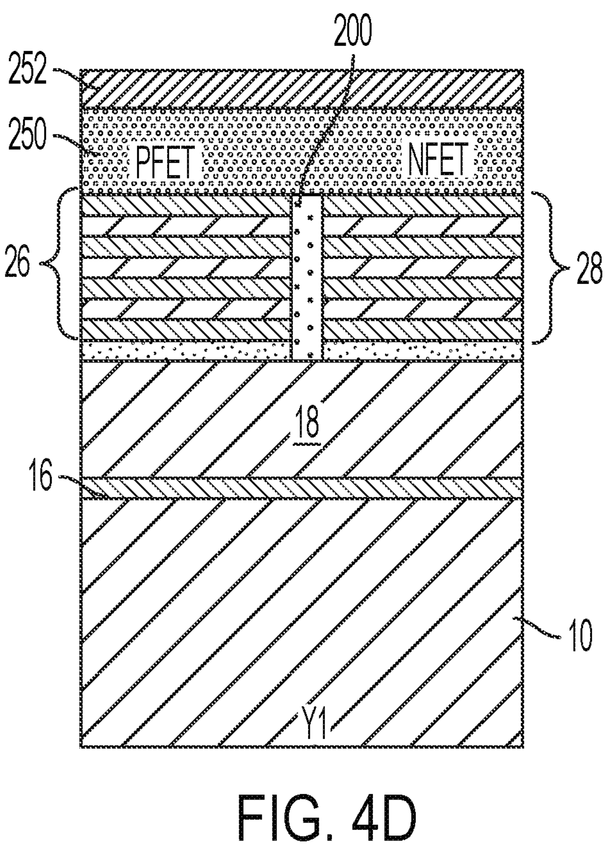
FIG. 4D depicts the cross-sectional view taken along the line Y1 of the semiconductor shown in FIG. 4A after the processing operation according to one or more embodiments of the invention.
Figure 4E:
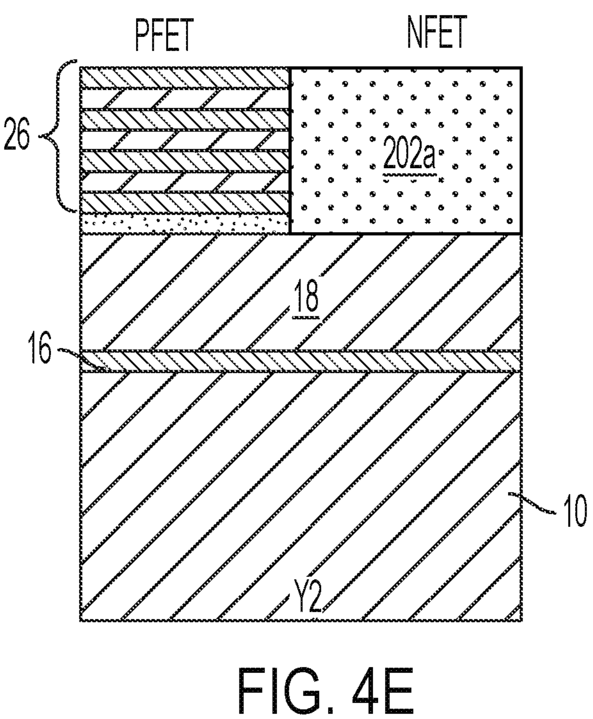
FIG. 4E depicts the cross-sectional view taken along the line Y2 of the semiconductor shown in FIG. 4A after the processing operation according to one or more embodiments of the invention.

FIGS. 5A through 5D depict the cross-sectional views of the semiconductor shown in FIG. 4A after forming gate spacers 254 on the sidewalls of the sacrificial gate 250 and the individual hardmasks 252. The gate spacers 254 can be formed by depositing a hardmask layer (not shown) that conforms to the outer surfaces of the sacrificial gates 250 and hardmasks 252, along with the upper surface of the PFET nanosheet structure 26 and the NFET nanosheet structures 28. The hardmask layer can then patterned according to a reactive ion etch (RIE) to remove portions of the hardmask layer from the upper surfaces of the hardmasks 252, the PFET nanosheet structure 26, and the NFET nanosheet structures 28. The portions of the hardmask layer remaining on the sidewalls of the sacrificial gates 250 define the gate spacers 254.

Figure 5A:
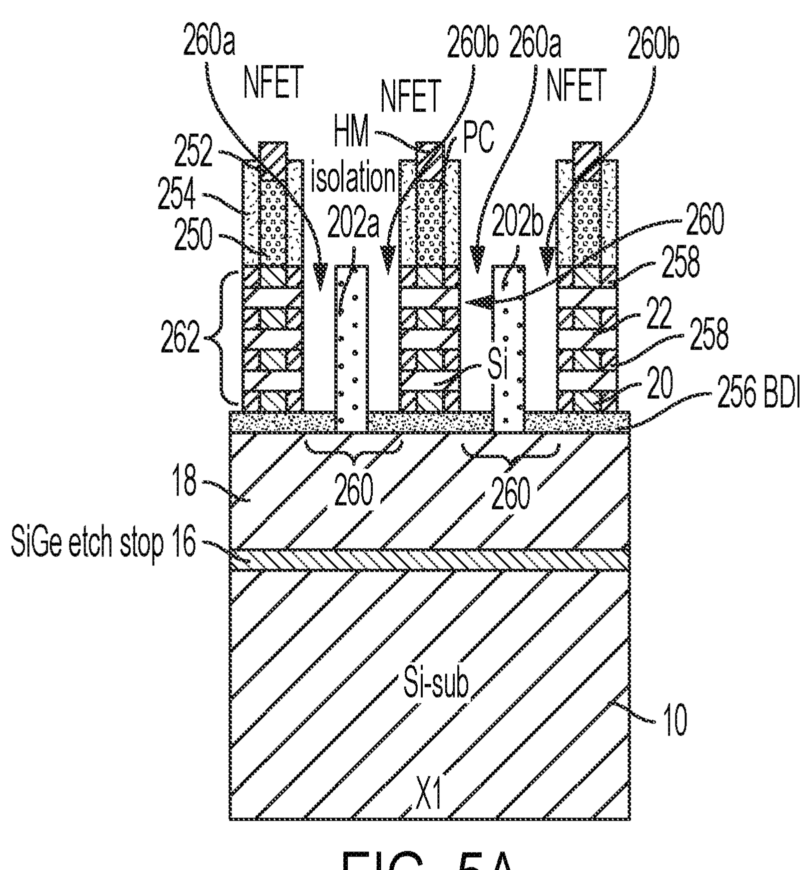
FIG. 5A depicts the cross-sectional view taken along the line X1 of the semiconductor shown in FIG. 4A after the processing operation according to one or more embodiments of the invention.
Figure 5B:
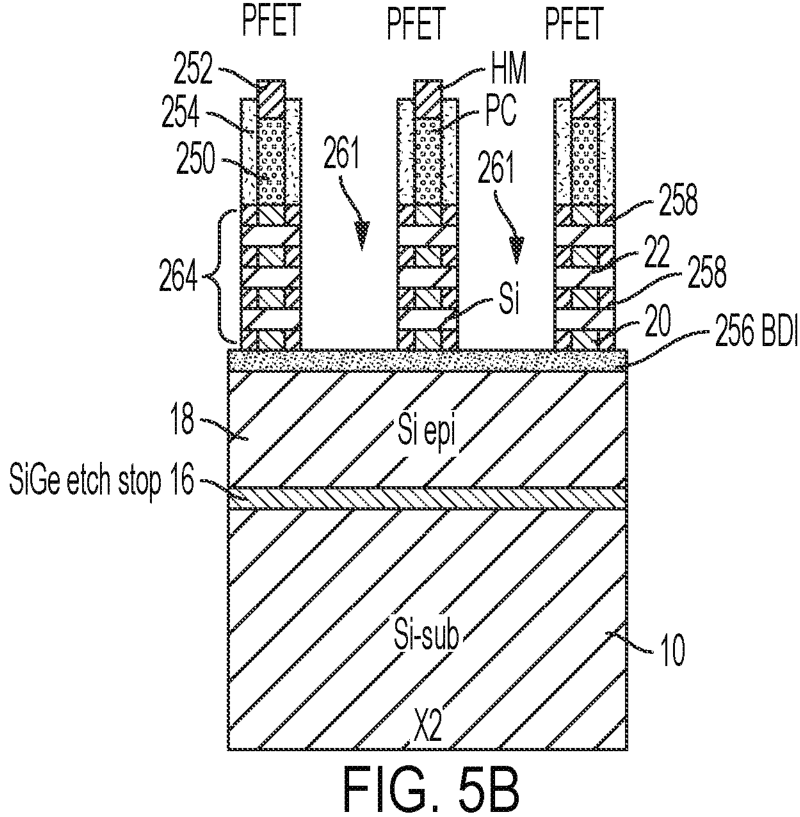
FIG. 5B depicts the cross-sectional view taken along the line X2 of the semiconductor shown in FIG. 4A after the processing operation according to one or more embodiments of the invention.
Figure 5C:
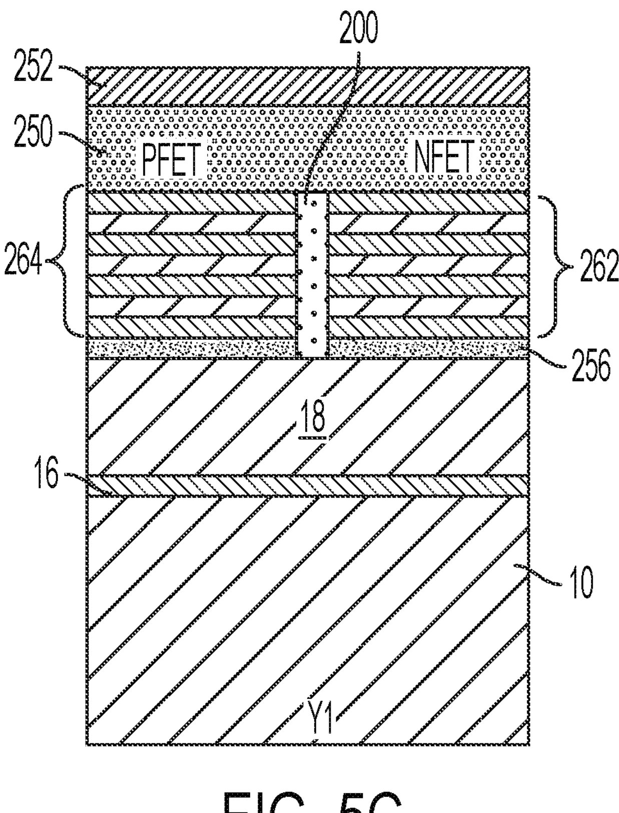
FIG. 5C depicts the cross-sectional view taken along the line Y1 of the semiconductor shown in FIG. 4A after the processing operation according to one or more embodiments of the invention.
Figure 5D:
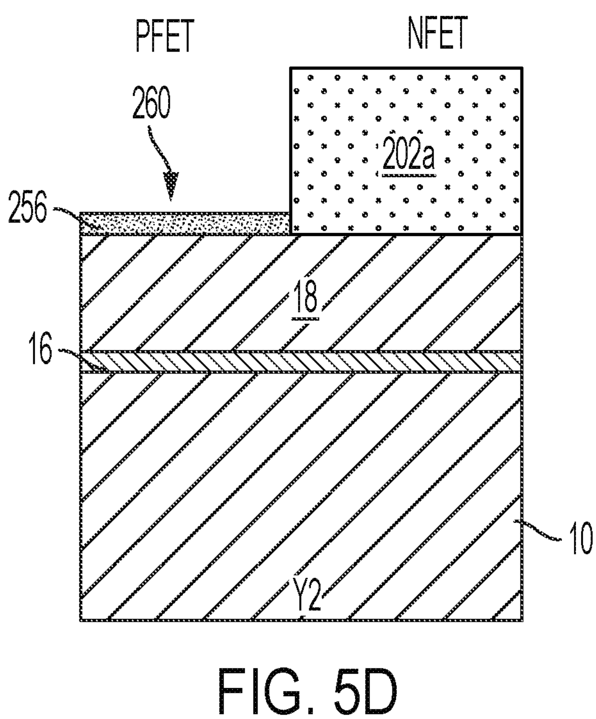
FIG. 5D depicts the cross-sectional view taken along the line Y2 of the semiconductor shown in FIG. 4A after the processing operation according to one or more embodiments of the invention.
Figure 6A:
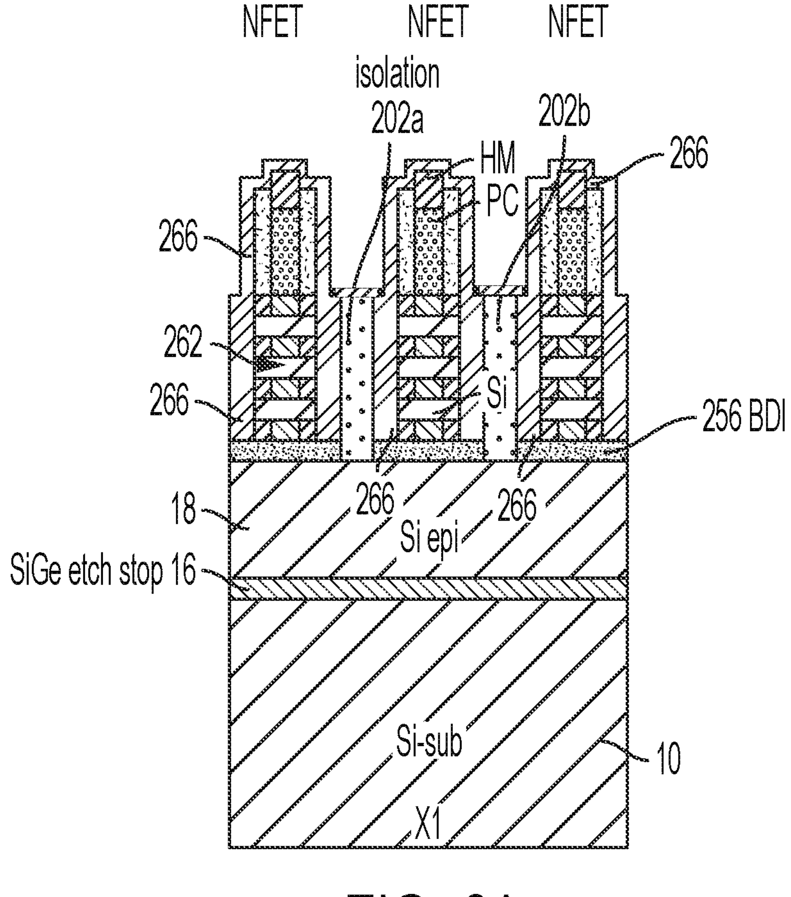
FIG. 6A depicts the cross-sectional view taken along the line X1 of the semiconductor shown in FIG. 4A after the processing operation according to one or more embodiments of the invention.
Figure 6B:
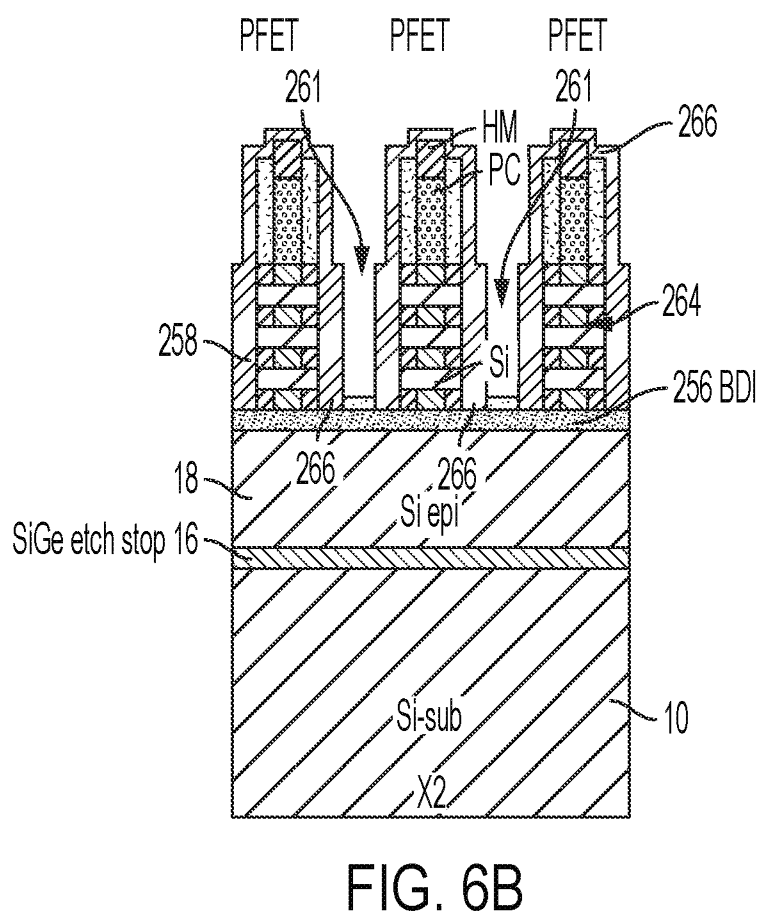
FIG. 6B depicts the cross-sectional view taken along the line X2 of the semiconductor shown in FIG. 4A after the processing operation according to one or more embodiments of the invention.
Figures 6C, 6D:
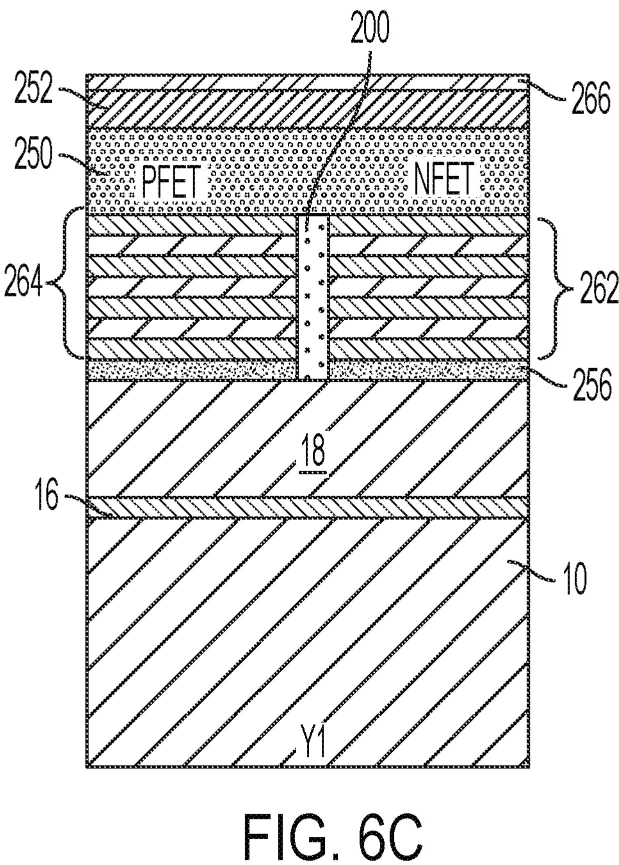
FIG. 6C depicts the cross-sectional view taken along the line Y1 of the semiconductor shown in FIG. 4A after the processing operation according to one or more embodiments of the invention.
FIG. 6D depicts the cross-sectional view taken along the line Y2 of the semiconductor shown in FIG. 4A after the processing operation according to one or more embodiments of the invention.
Figure 7A:
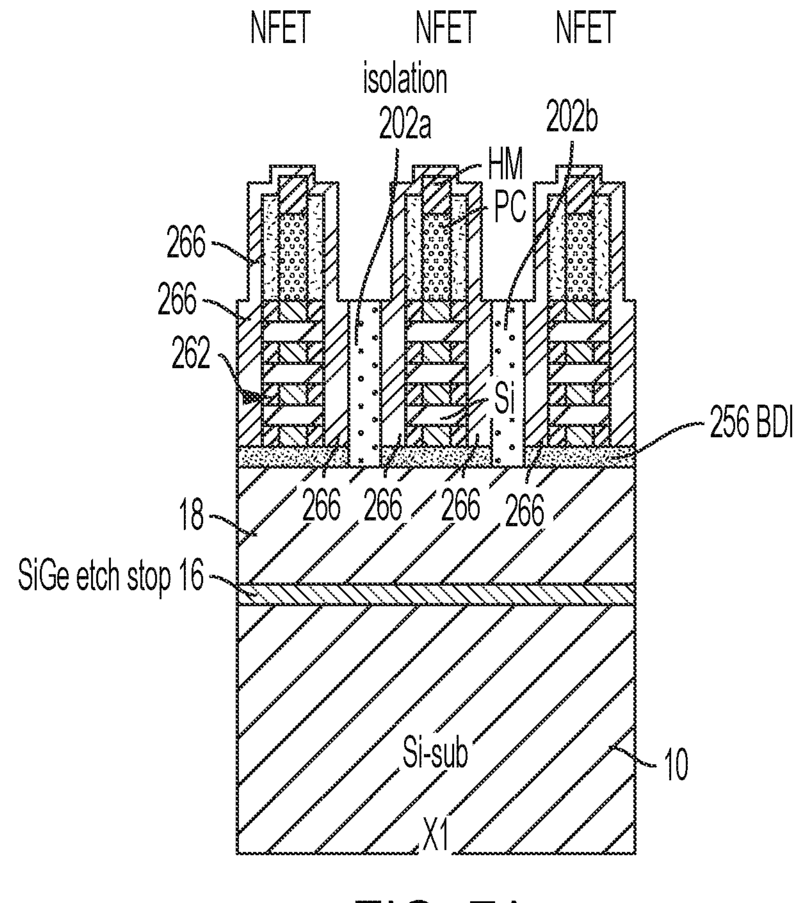
FIG. 7A depicts the cross-sectional view taken along the line X1 of the semiconductor shown in FIG. 4A after the processing operation according to one or more embodiments of the invention.
Figure 7B:
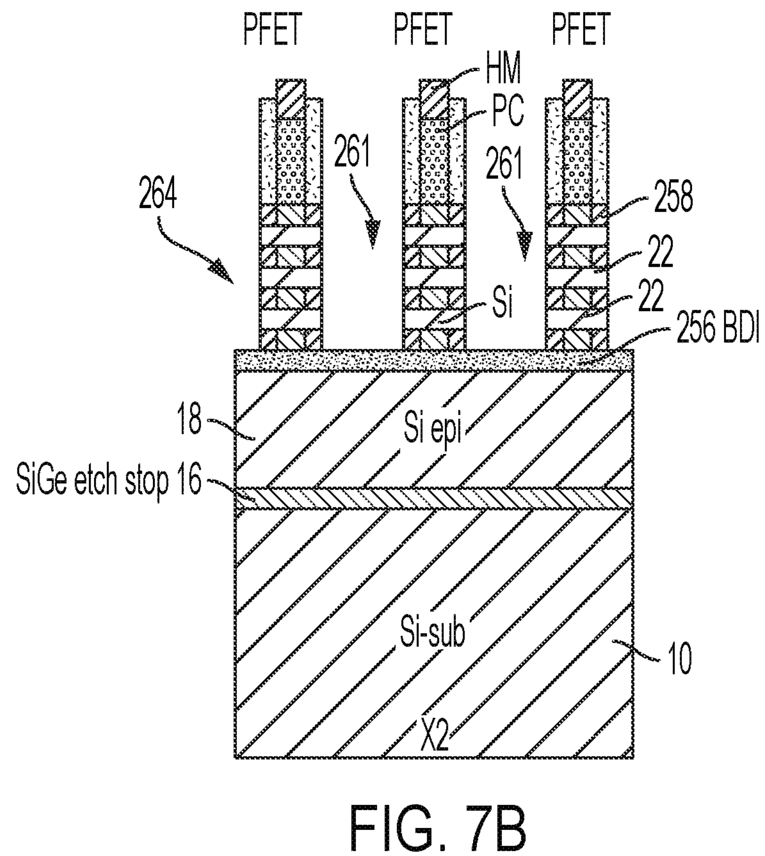
FIG. 7B depicts the cross-sectional view taken along the line X2 of the semiconductor shown in FIG. 4A after the processing operation according to one or more embodiments of the invention.
Figure 7C:
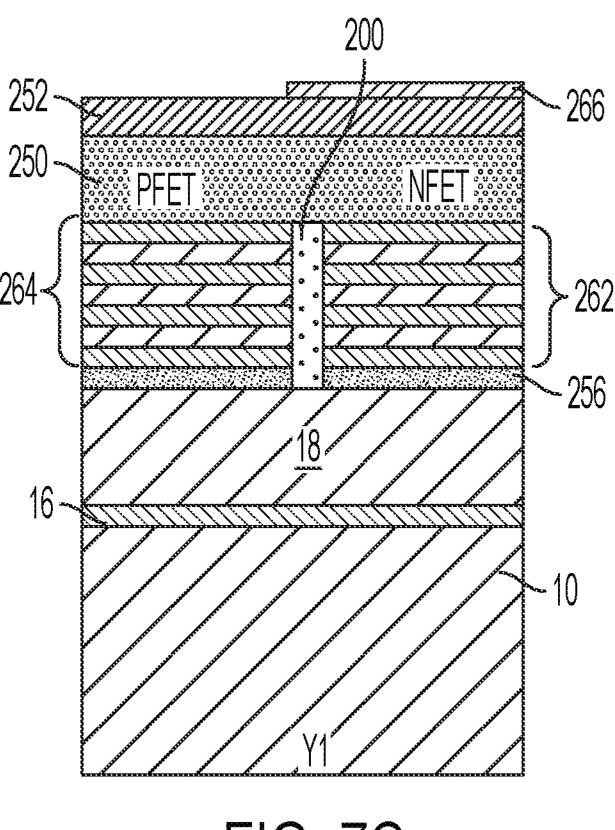
FIG. 7C depicts the cross-sectional view taken along the line Y1 of the semiconductor shown in FIG. 4A after the processing operation according to one or more embodiments of the invention.
Figure 7D:
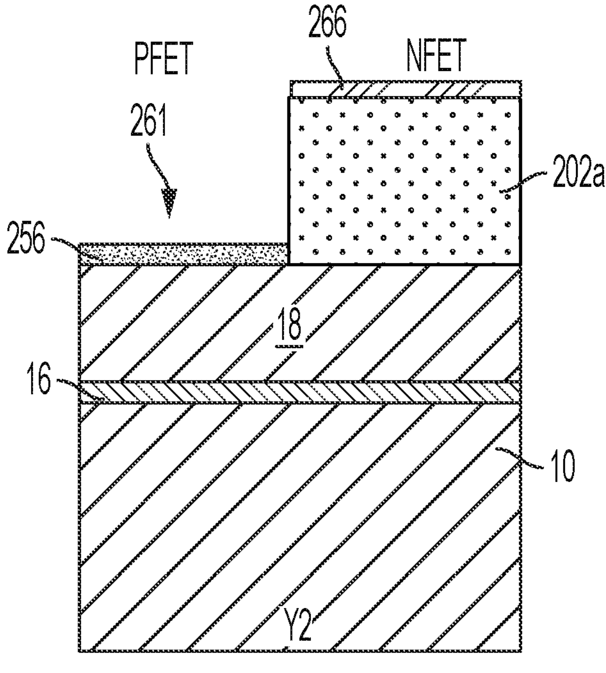
FIG. 7D depicts the cross-sectional view taken along the line Y2 of the semiconductor shown in FIG. 4A after the processing operation according to one or more embodiments of the invention.
Figure 8A:
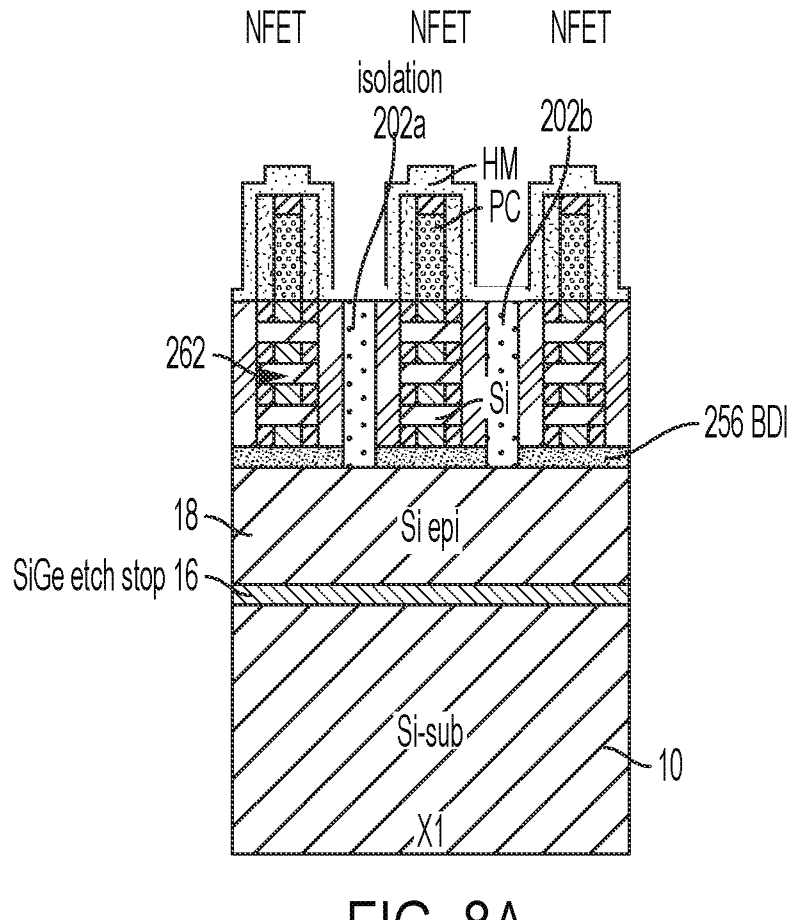
FIG. 8A depicts the cross-sectional view taken along the line X1 of the semiconductor shown in FIG. 4A after the processing operation according to one or more embodiments of the invention.
Figure 8B:
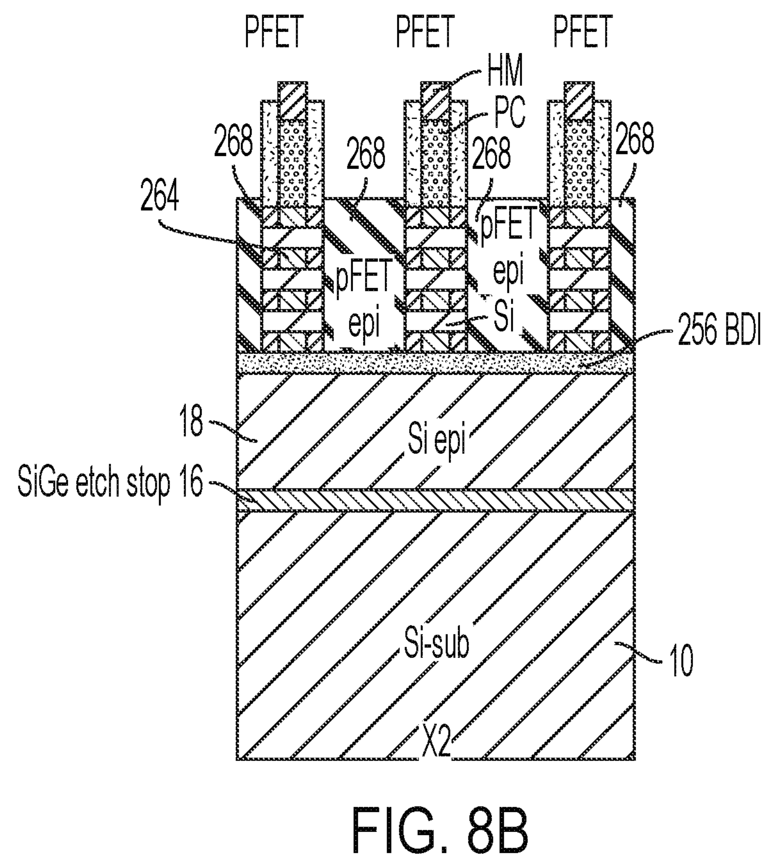
FIG. 8B depicts the cross-sectional view taken along the line X2 of the semiconductor shown in FIG. 4A after the processing operation according to one or more embodiments of the invention.
Figures 8C, 8D:
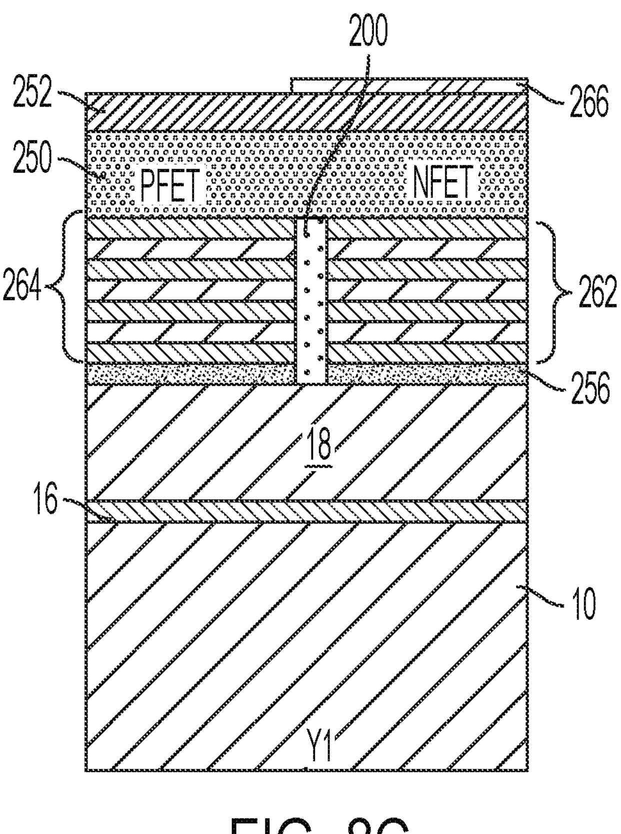
FIG. 8C depicts the cross-sectional view taken along the line Y1 of the semiconductor shown in FIG. 4A after the processing operation according to one or more embodiments of the invention.
FIG. 8D depicts the cross-sectional view taken along the line Y2 of the semiconductor shown in FIG. 4A after the processing operation according to one or more embodiments of the invention.
Figure 9A:
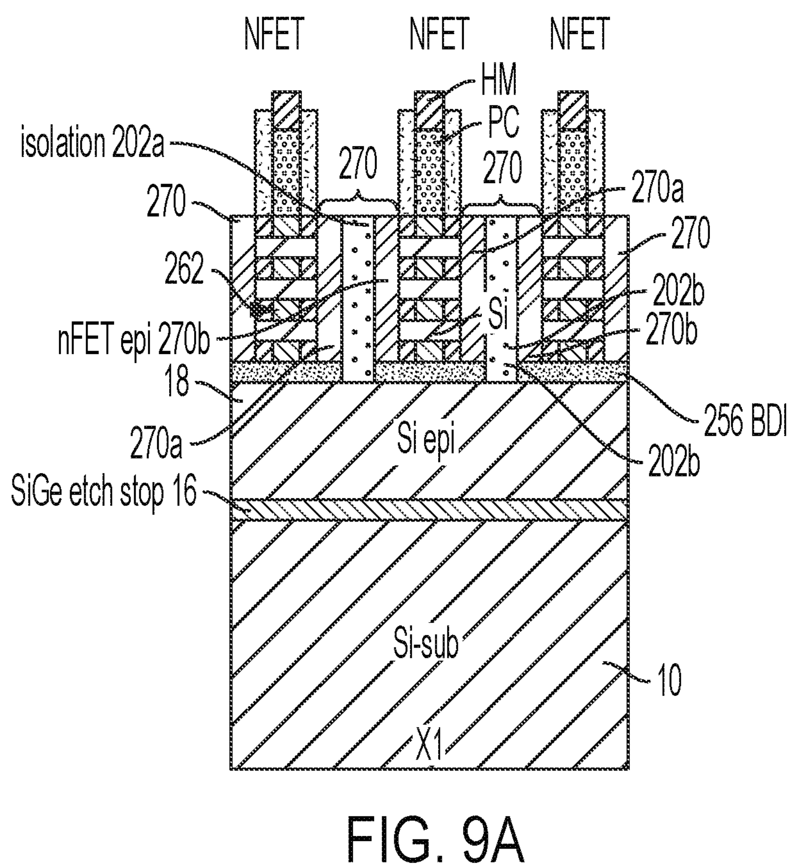
FIG. 9A depicts the cross-sectional view taken along the line X1 of the semiconductor shown in FIG. 4A after the processing operation according to one or more embodiments of the invention.
Figure 9B:
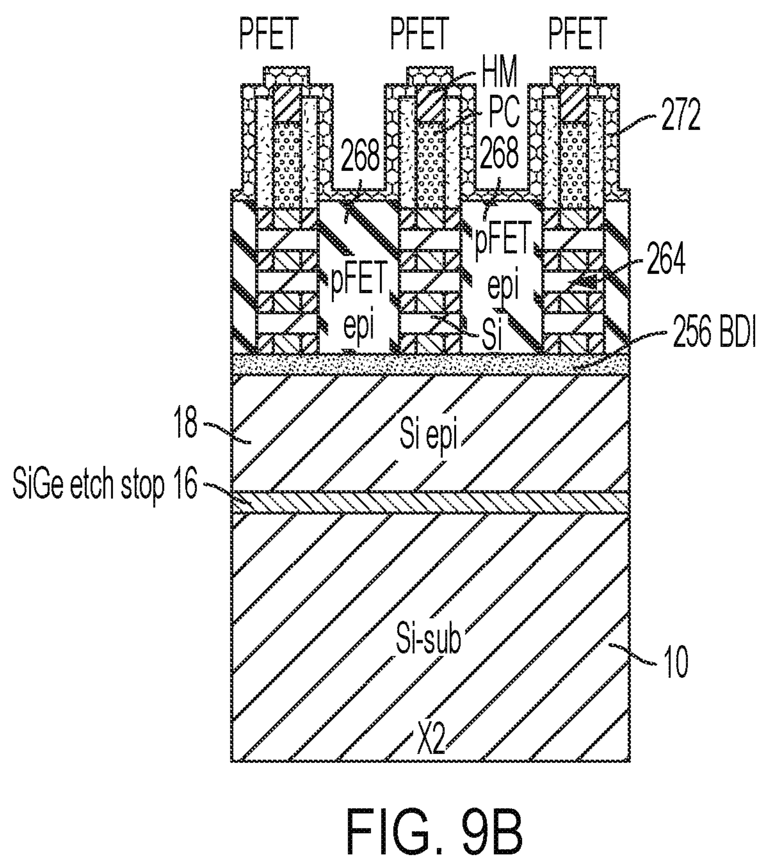
FIG. 9B depicts the cross-sectional view taken along the line X2 of the semiconductor shown in FIG. 4A after the processing operation according to one or more embodiments of the invention.
Figures 9C, 9D:
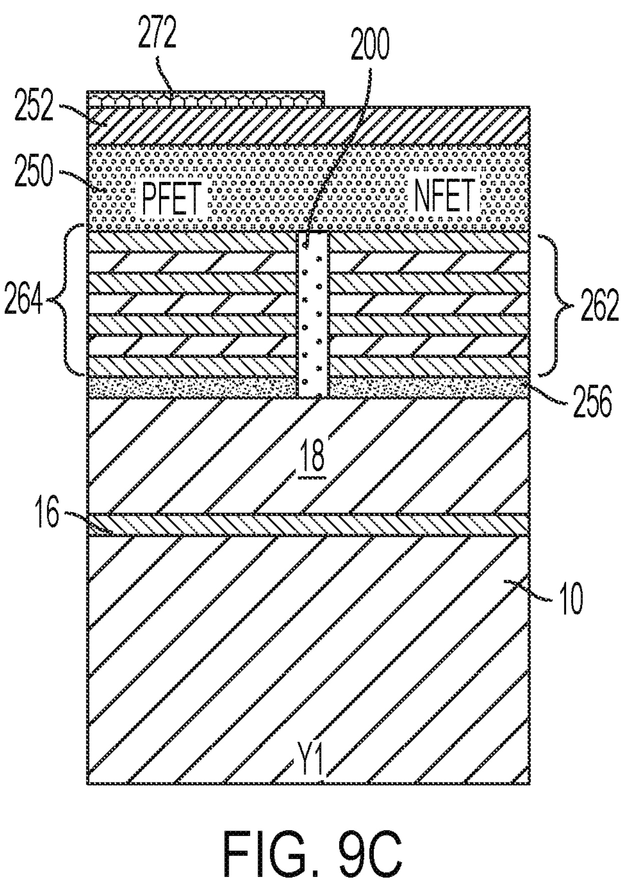
FIG. 9C depicts the cross-sectional view taken along the line Y1 of the semiconductor shown in FIG. 4A after the processing operation according to one or more embodiments of the invention.
FIG. 9D depicts the cross-sectional view taken along the line Y2 of the semiconductor shown in FIG. 4A after the processing operation according to one or more embodiments of the invention.
Figure 10A:
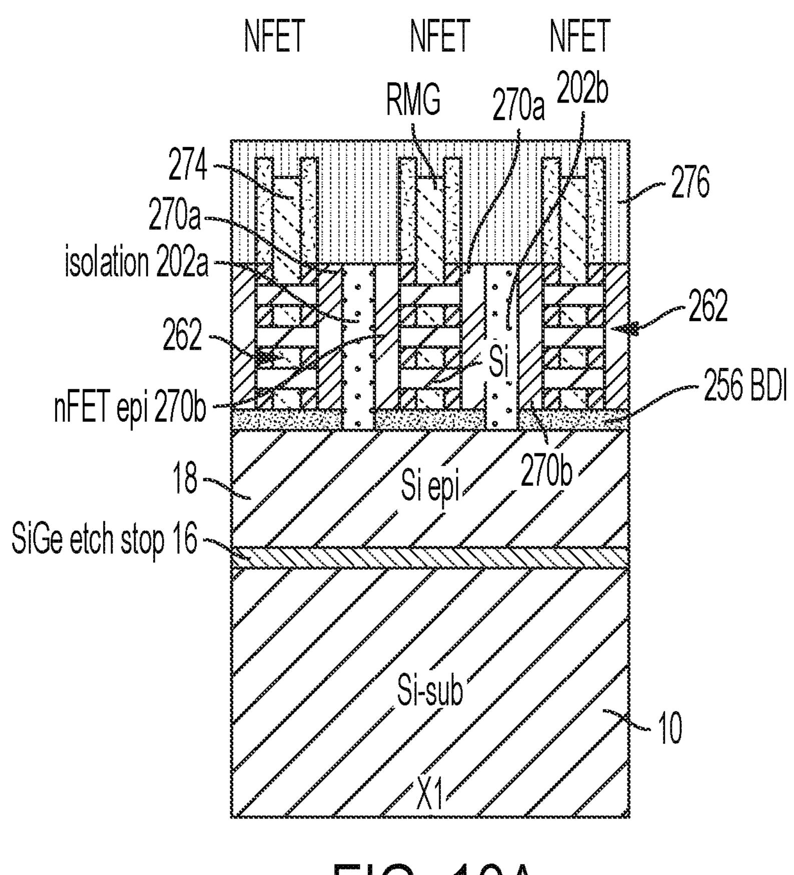
FIG. 10A depicts the cross-sectional view taken along the line X1 of the semiconductor shown in FIG. 4A after the processing operation according to one or more embodiments of the invention.
Figure 10B:
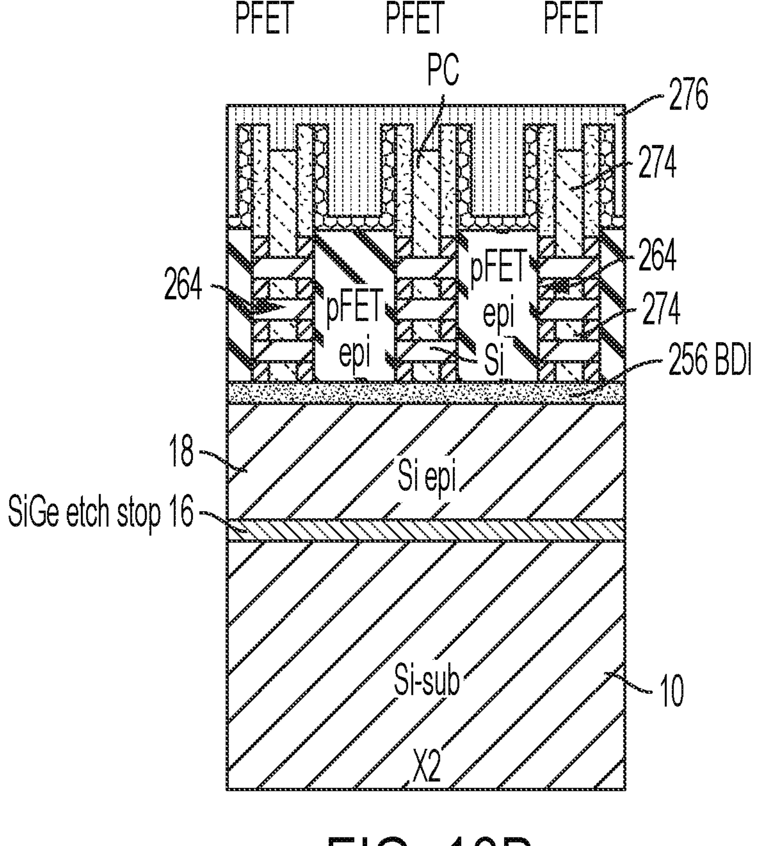
FIG. 10B depicts the cross-sectional view taken along the line X2 of the semiconductor shown in FIG. 4A after the processing operation according to one or more embodiments of the invention.
Figures 10C, 10D:
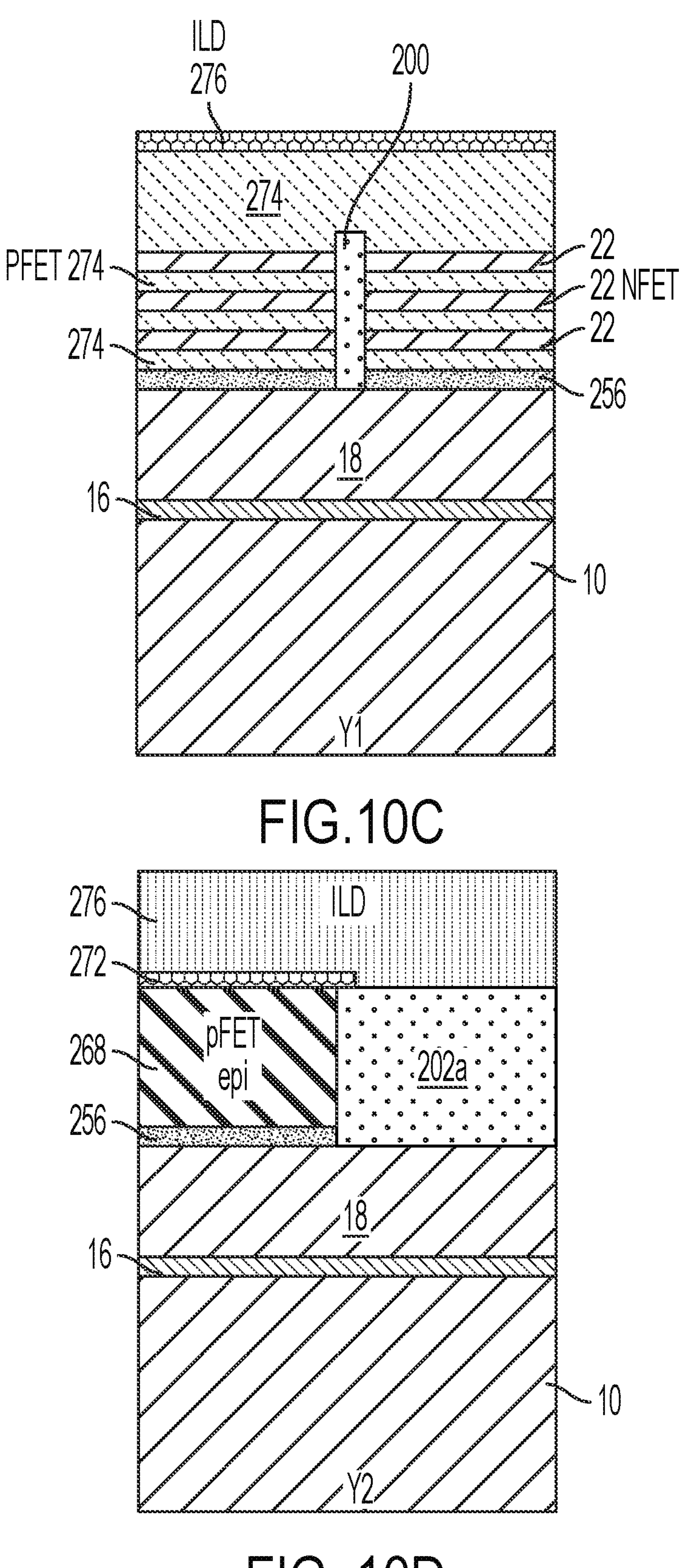
FIG. 10C depicts the cross-sectional view taken along the line Y1 of the semiconductor shown in FIG. 4A after the processing operation according to one or more embodiments of the invention.
FIG. 10D depicts the cross-sectional view taken along the line Y2 of the semiconductor shown in FIG. 4A after the processing operation according to one or more embodiments of the invention.
Figures 11A, 11B:
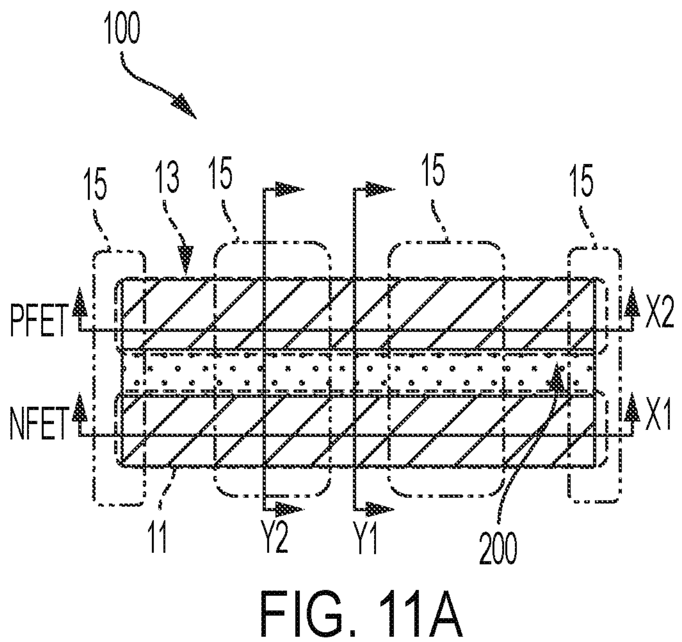
FIG. 11A depicts the top-down reference view of the semiconductor wafer after a processing operation according to one or more embodiments of the invention according to one or more embodiments of the invention.
FIG. 11B depicts the cross-sectional view taken along the line X1 of the semiconductor shown in FIG. 11A after the processing operation according to one or more embodiments of the invention.
Figure 11C:
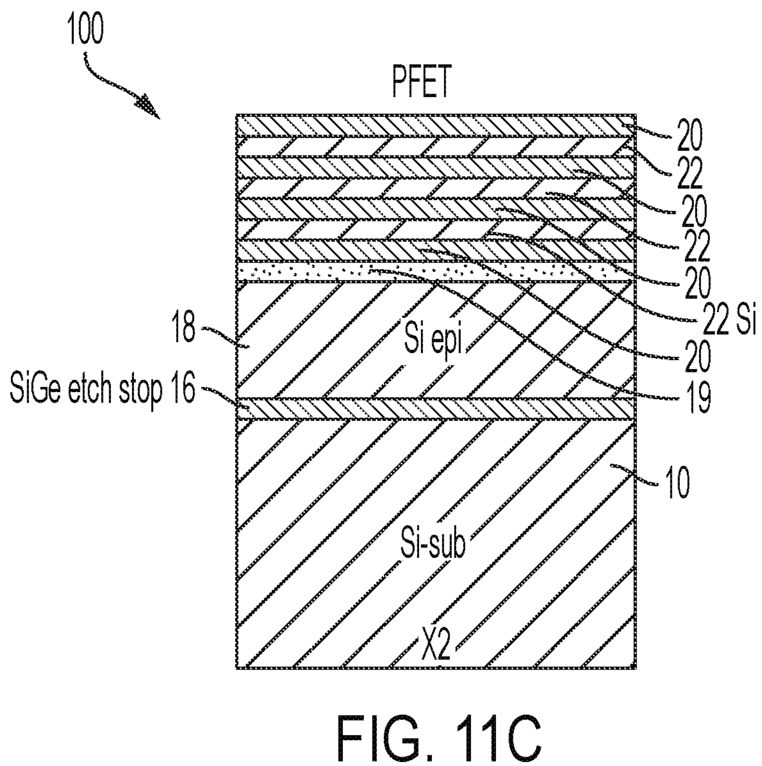
FIG. 11C depicts the cross-sectional view taken along the line X2 of the semiconductor shown in FIG. 11A after the processing operation according to one or more embodiments of the invention.
Figure 11D:
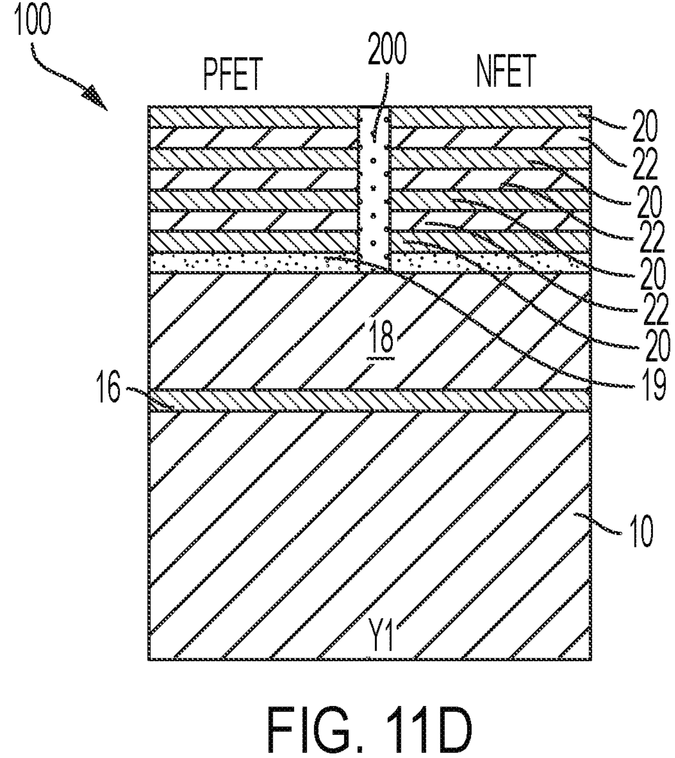
FIG. 11D depicts the cross-sectional view taken along the line Y1 of the semiconductor shown in FIG. 11A after the processing operation according to one or more embodiments of the invention.
Figure 11E:
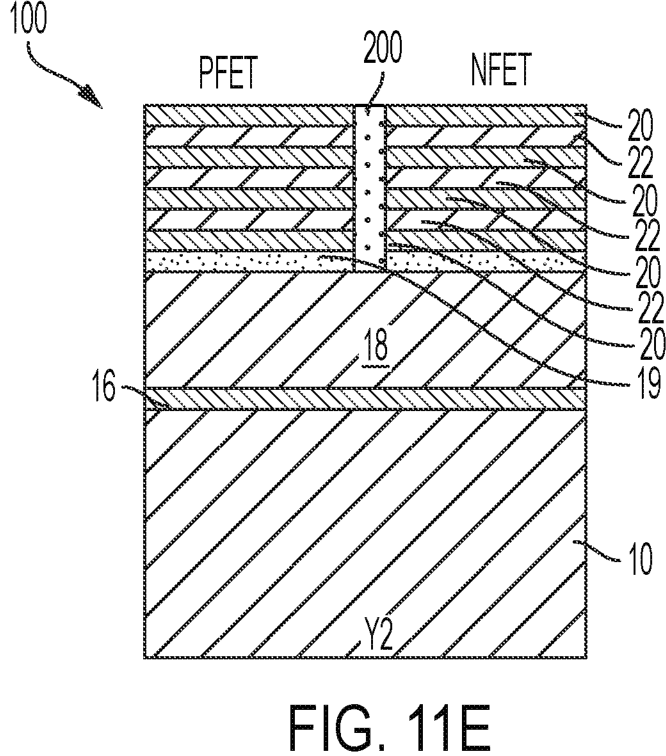
FIG. 11E depicts the cross-sectional view taken along the line Y2 of the semiconductor shown in FIG. 11A after the processing operation according to one or more embodiments of the invention.
Figure 12A:
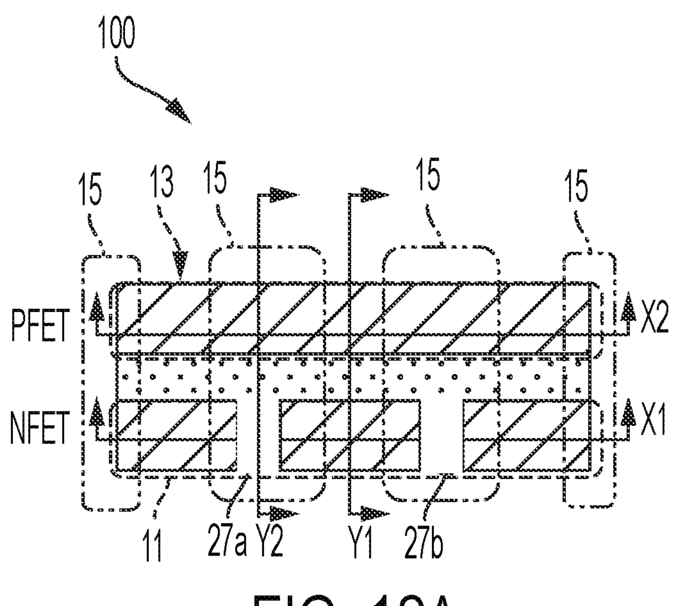
FIG. 12A depicts the top-down reference view of the semiconductor wafer after a processing operation according to one or more embodiments of the invention according to one or more embodiments of the invention.
Figure 12B:
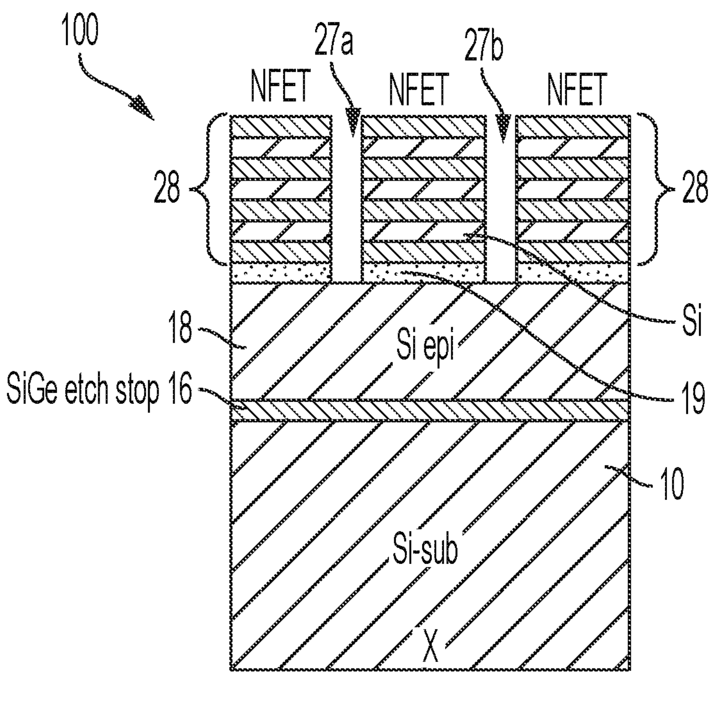
FIG. 12B depicts the cross-sectional view taken along the line X1 of the semiconductor shown in FIG. 12A after the processing operation according to one or more embodiments of the invention.
Figure 12C:
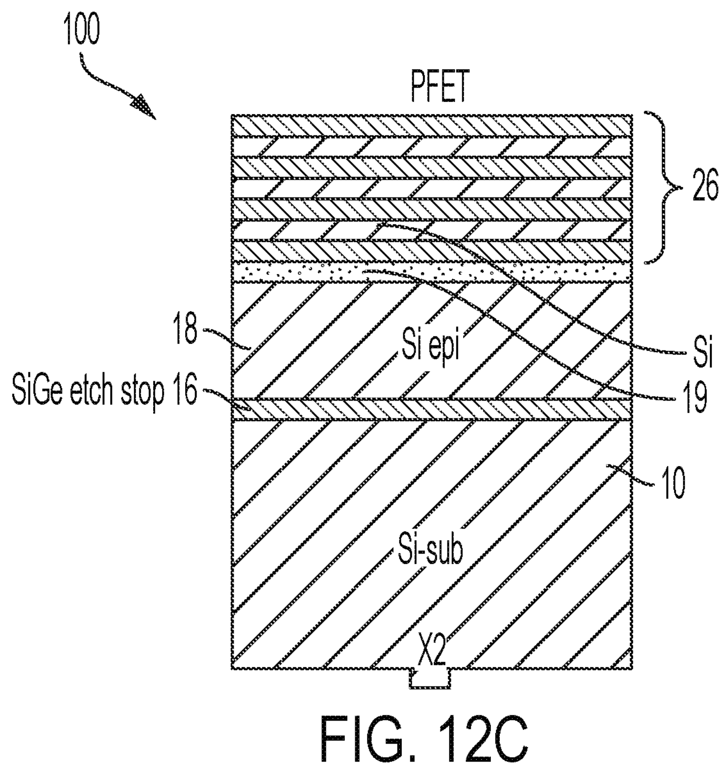
FIG. 12C depicts the cross-sectional view taken along the line X2 of the semiconductor shown in FIG. 12A after the processing operation according to one or more embodiments of the invention.
Figure 12D:
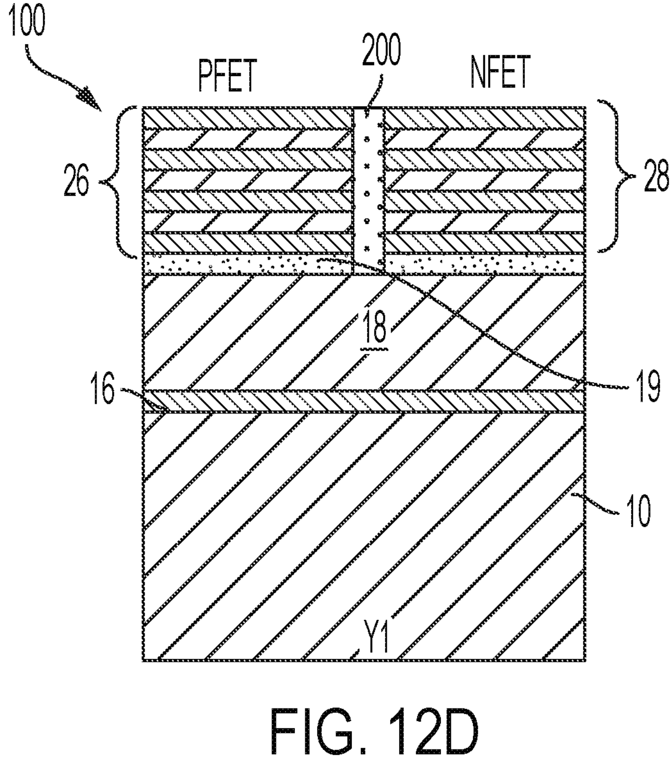
FIG. 12D depicts the cross-sectional view taken along the line Y1 of the semiconductor shown in FIG. 12A after the processing operation according to one or more embodiments of the invention.
Figure 12E:
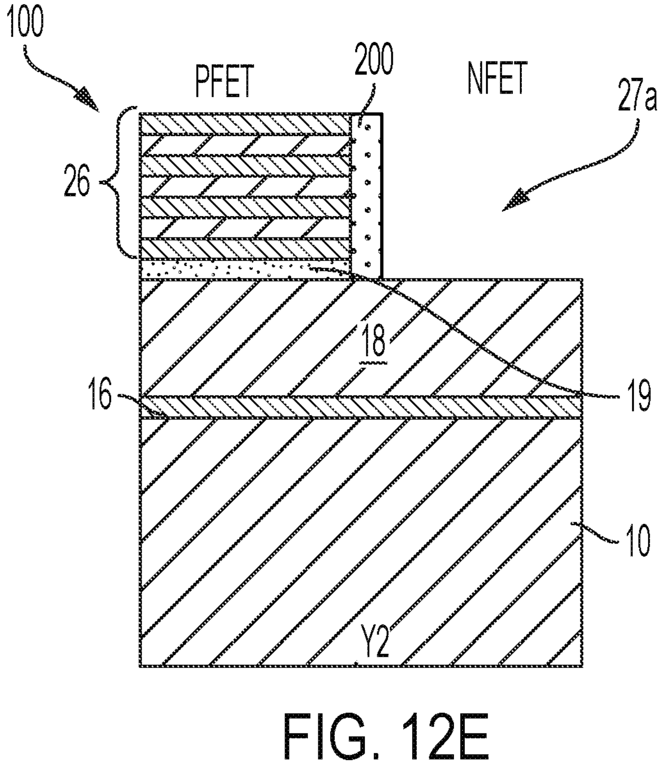
FIG. 12E depicts the cross-sectional view taken along the line Y2 of the semiconductor shown in FIG. 12A after the processing operation according to one or more embodiments of the invention.
Figure 13A:
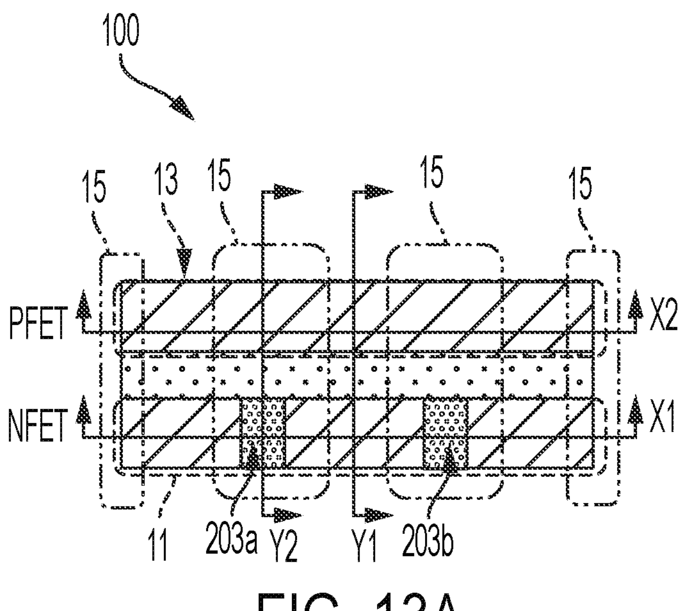
FIG. 13A depicts the top-down reference view of the semiconductor wafer after a processing operation according to one or more embodiments of the invention according to one or more embodiments of the invention.
Figure 13B:
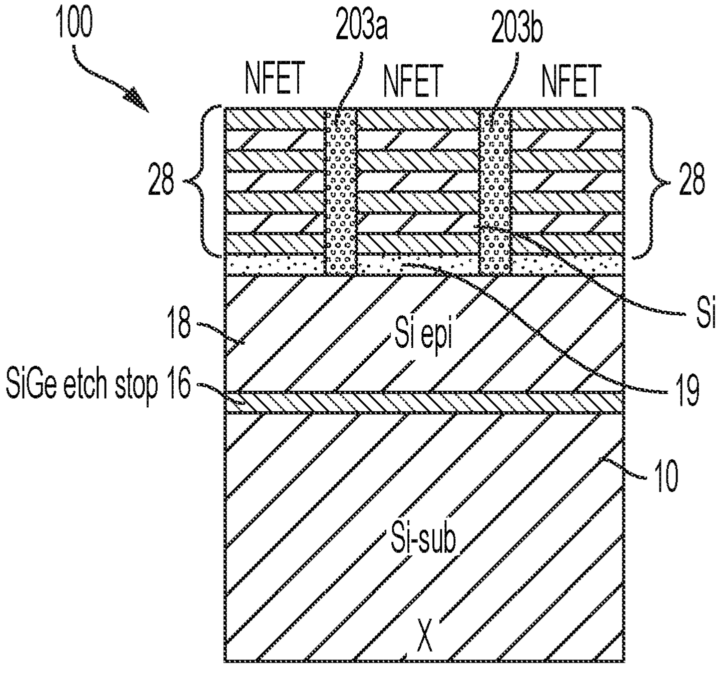
FIG. 13B depicts the cross-sectional view taken along the line X1 of the semiconductor shown in FIG. 13A after the processing operation according to one or more embodiments of the invention.
Figure 13C:
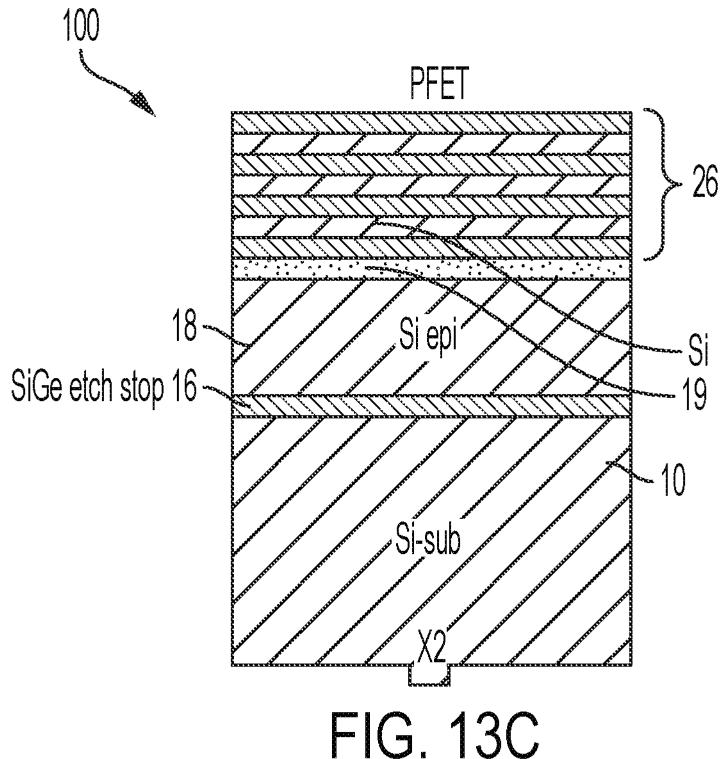
FIG. 13C depicts the cross-sectional view taken along the line X2 of the semiconductor shown in FIG. 13A after the processing operation according to one or more embodiments of the invention.
Figure 13D:
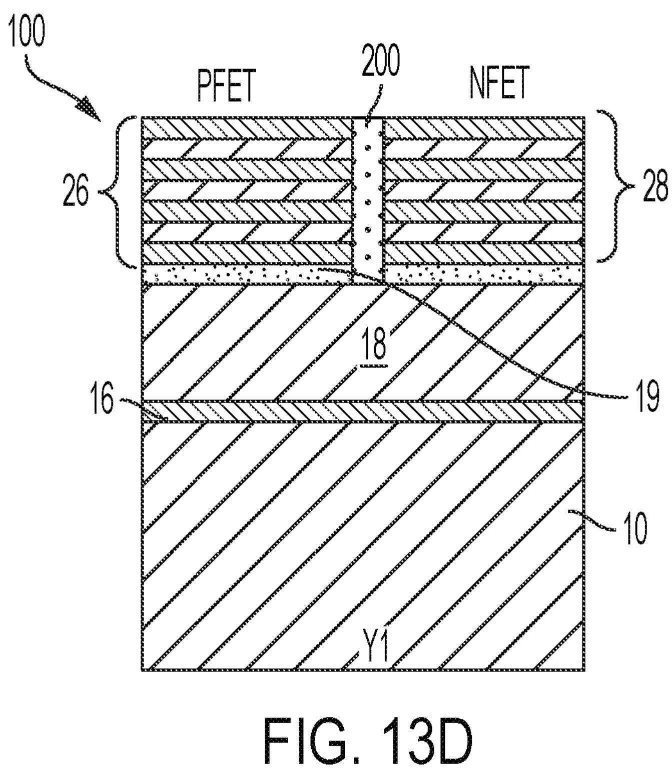
FIG. 13D depicts the cross-sectional view taken along the line Y1 of the semiconductor shown in FIG. 13A after the processing operation according to one or more embodiments of the invention.
Figure 13E:
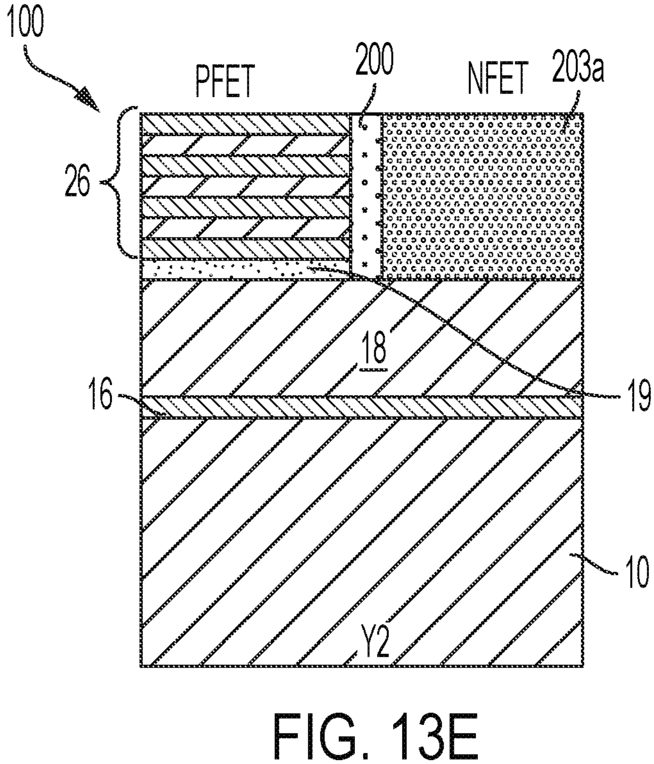
FIG. 13E depicts the cross-sectional view taken along the line Y2 of the semiconductor shown in FIG. 13A after the processing operation according to one or more embodiments of the invention.
Figures 14A, 14B:
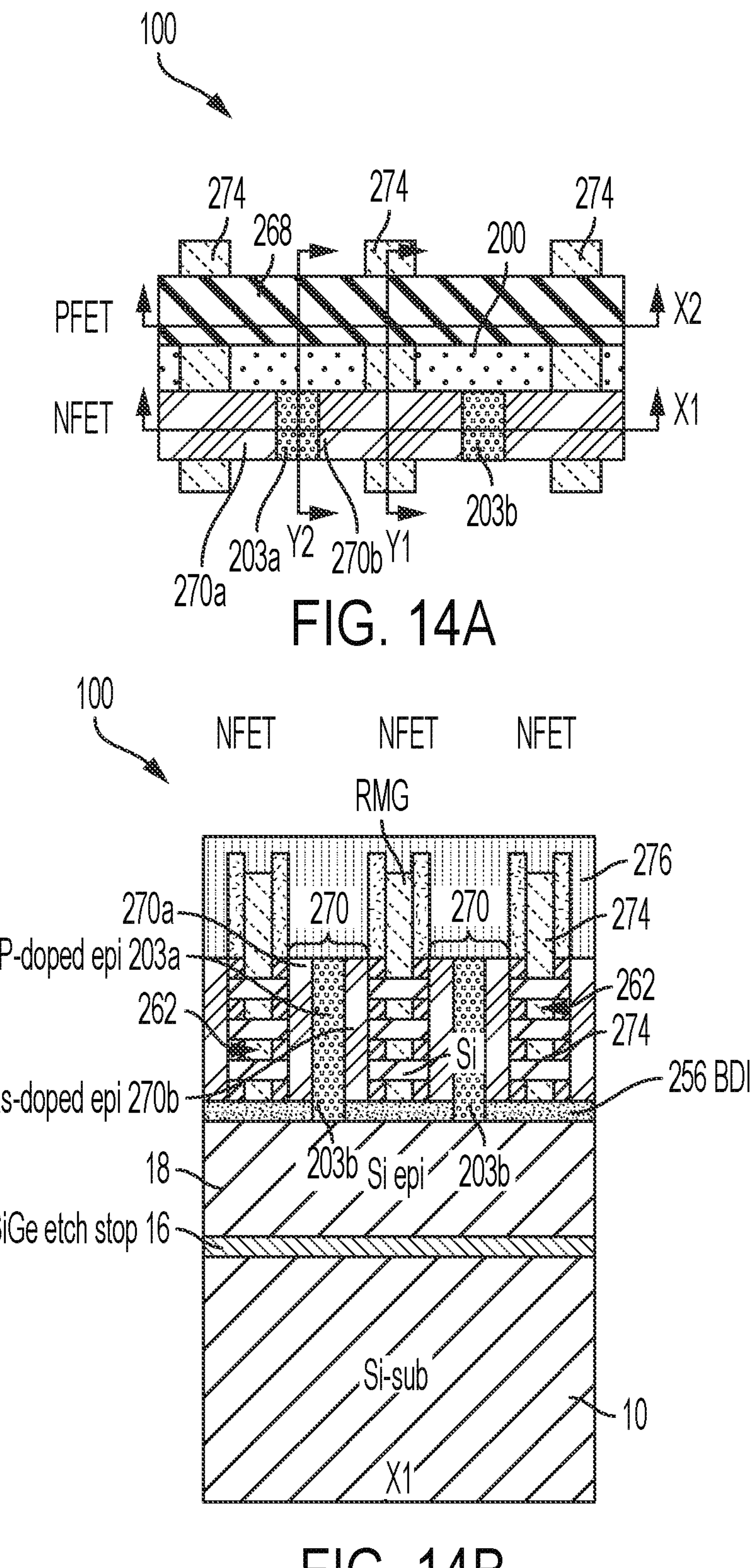
FIG. 14A depicts the top-down reference view of the semiconductor wafer after a processing operation according to one or more embodiments of the invention according to one or more embodiments of the invention.
FIG. 14B depicts the cross-sectional view taken along the line X1 of the semiconductor shown in FIG. 14A after the processing operation according to one or more embodiments of the invention.
Figure 14C:
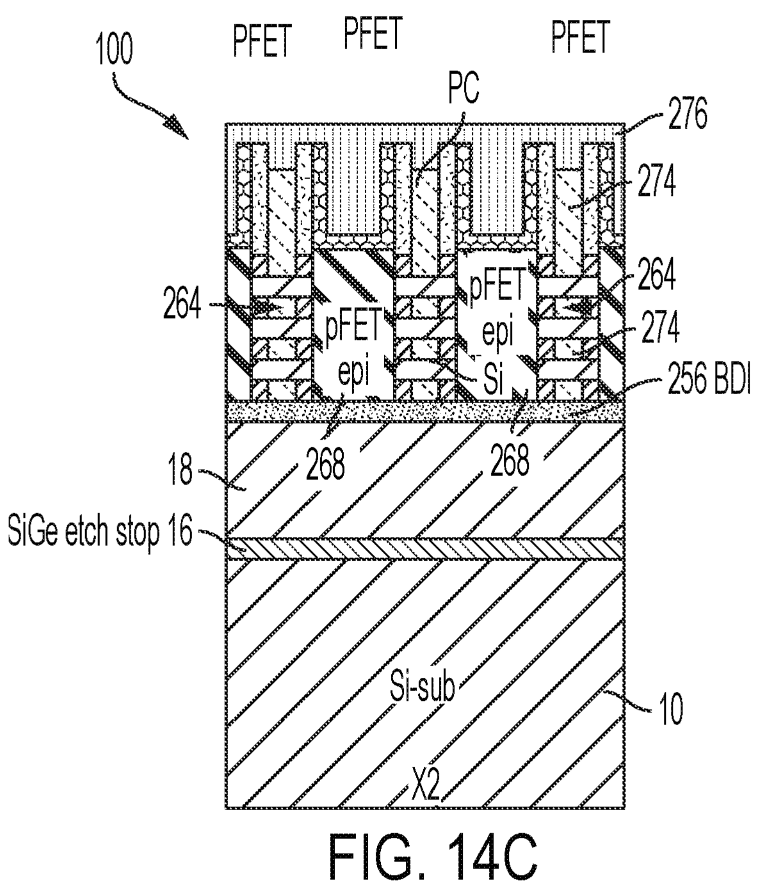
FIG. 14C depicts the cross-sectional view taken along the line X2 of the semiconductor shown in FIG. 14A after the processing operation according to one or more embodiments of the invention.
Figure 14D:
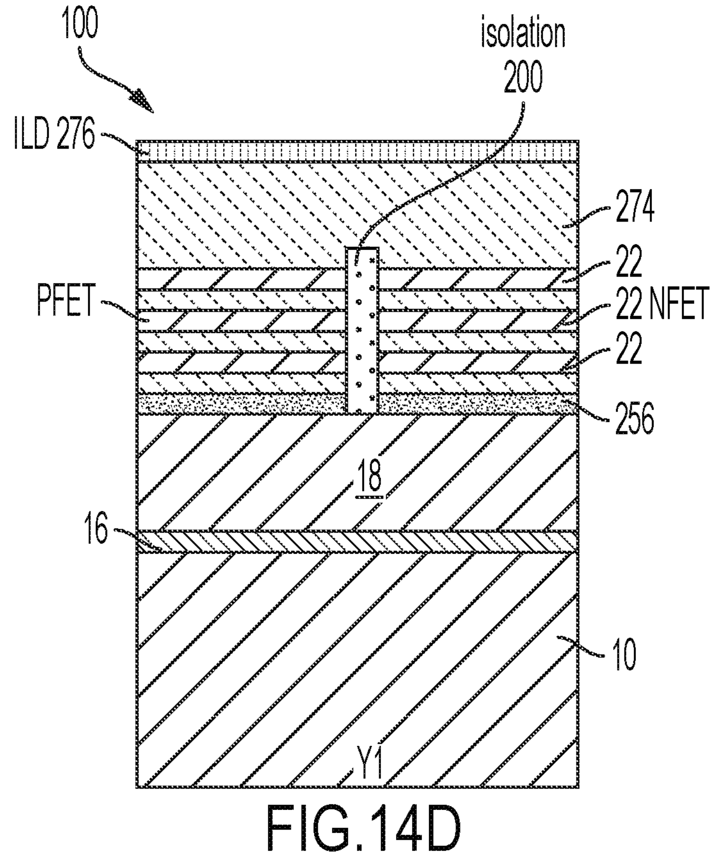
FIG. 14D depicts the cross-sectional view taken along the line Y1 of the semiconductor shown in FIG. 14A after the processing operation according to one or more embodiments of the invention.
Figure 14E:
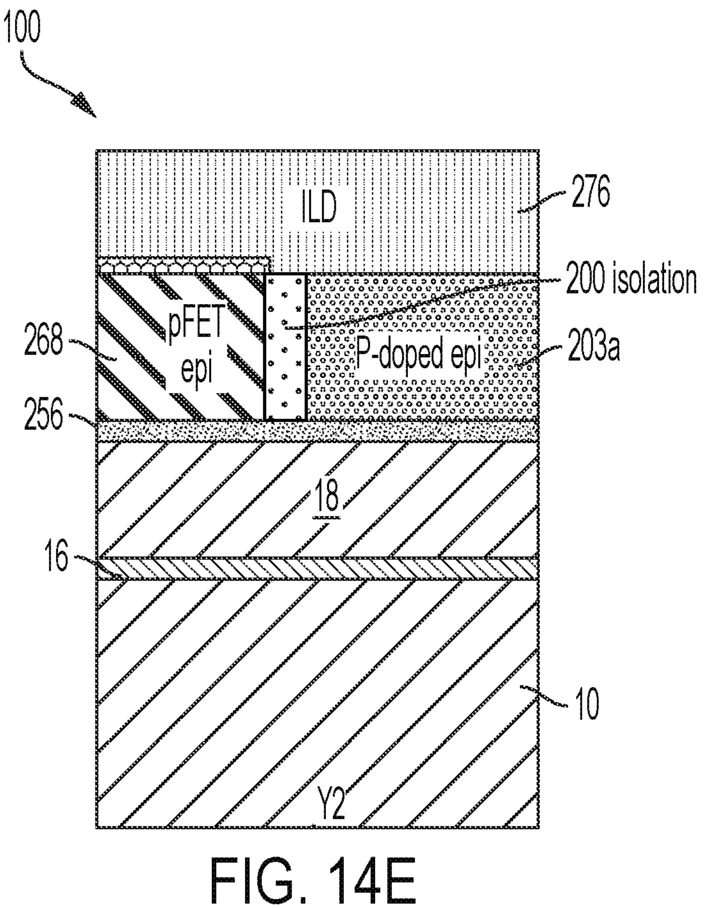
FIG. 14E depicts the cross-sectional view taken along the line Y2 of the semiconductor shown in FIG. 14A after the processing operation according to one or more embodiments of the invention.

With continued reference to FIGS. 5A through 5C, the semiconductor device 100 is illustrated following nanosheet recession, formation of a sacrificial silicon (SASI) layer 256, and formation of inner spacers 258. The nanosheet recession can be performed according to a selective RIE that is selective to the material of the sacrificial nanosheets 20 and the active semiconductor nanosheets 22. Accordingly, exposed portions of the PFET nanosheet structure 26, and the NFET nanosheet structures 28 are recessed without etching (or substantially etching) the sub-walls 202*a* and 202*b* of the t-shaped backbone. The nanosheet recession forms source/drain cavities 260 that define a plurality of nanosheet fins 262 in the NFET region 11 (referred to herein as NFET fins 262) and source/drain cavities 261 that define a plurality of nanosheet fins 264 in the PFET region 13 (referred to herein as PFET fins 264). As shown in FIGS. 5A and 5B, for example, the PFET source/drain cavities 261 are formed as a single cavity extending continuously between a neighboring pair of PFET nanosheet fins 264. The NFET source/drain cavities 260, however, are formed as two sub-cavities 260*a* and 260*b* separated by one another by a respective sub-wall 202*a* and 202*b*. Accordingly, the width of each NFET sub-cavity 260*a* and 260*b* is less than the width of a given PFET cavity 261.

The SASI layer 256 can be formed by selectively etching the second sacrificial layer 19 to form a cavity between the semiconductor layer 18 and the lower-most sacrificial nanosheet 20. A deposition process is then performed to fill the cavity with a low-k dielectric material. According to a non-limiting embodiment of the present invention, a conformal deposition process such as atomic layer deposition (ALD), for example, is performed to deposit the low-k material. The low-k material includes, but is not limited to silicon nitride (SiN), silicon boron carbonitride (SiBCN), silicon oxycarbonitride (SiOCN), silicon oxynitride (SiON), silicon carbide (SiC), and/or the like. An etching process such as anisotropic spacer RIE is performed to remove the insulating material from horizontal portions of the structure such as the top surface of the hardmasks 252 and the top surface of portions of the t-shaped backbone (i.e., the dielectric wall 200 and dielectric sub-walls 202*a* and 202*b*).

The inner spacers 258 are formed in contact with sidewalls of the sacrificial nanosheets 20. In one embodiment, the inner spacers 258 are formed by removing a portion of the sacrificial nanosheets 20 to reduce their size in at least one lateral dimension (i.e., length, width). The portion of the sacrificial nanosheets 20 may be removed using an isotropic etch (e.g., wet chemical etch, non-directional dry plasma etch, etc.), where the isotropic etch etches laterally into the sacrificial nanosheets 20. The isotropic etch may remove a predetermined amount of material from the sacrificial nanosheets 20, where the etch may be a timed etch to uniformly remove an equal amount of material from each exposed end. The isotropic etch may form indentations having a predetermined indentation depth into the sacrificial nanosheets 20. After the etching process, the active semiconductor nanosheets 22 (i.e., the channels 22) may extend past the sacrificial nanosheets 20 by a predetermined distance.

Referring now to FIGS. 6A through 6D, the semiconductor device 100 is illustrated after depositing a dielectric liner 266. The dielectric liner 266 can be formed by depositing a low-k dielectric material using ALD, for example, which conforms to the outer surfaces of the semiconductor device 100. In the PFET region 13, the dielectric liner 266 conforms to the sidewalls and the base of the source/drain cavities 260, while still leaving a space or void between neighboring PFET nanosheet fins 264 (see FIG. 6B). In the NFET region 11, however, the conformal dielectric liner 266 is "pinched-off" and completely fills the source/drain cavities 260 due to the reduced distance between the NFET nanosheet fins 262 and the dielectric sub-walls 202*a* and 202*b* (see FIG. 6A).

Turning to FIGS. 7A through 7D, the semiconductor device 100 is illustrated after removing a portion of the dielectric liner 266 located in the PFET region 13. For example, a first portion of the dielectric liner 266 located in the NFET region 11 can be covered or "masked" while a second portion of the dielectric liner 266 located in the PFET region 13 is exposed. An etch process can then be performed to selectively remove the dielectric liner 266 from the PFET region 13, including from within the PFET source/drain cavities 260 to expose the underlying SASI 256, the sidewalls of the inner spacers 258, and the sidewalls of the active semiconductor nanosheets 22 (i.e., channels 22).

In FIGS. 8A through 8D, the semiconductor device 100 is illustrated after forming source/drains 268 in the PFET region 13 (i.e., PFET source/drains 268). In one or more embodiments of the invention, the PFET source/drains 268 are formed by epitaxially growing a semiconductor material from the exposed sides of the active semiconductor nanosheets 22 (i.e., channels 22). As described herein, the dielectric liner 266 effectively serves to protect the NFET source/drain regions 15 from inadvertent growth of PFET epitaxy. In addition, a separate mask is not required to cover the NFET region 11 during growth of the PFET epitaxy because the dielectric liner 266 is self-aligned in the NFET source/drain region 15. Accordingly, concerns pertaining to source/drain lithography misalignment found in conventional forksheet fabrication methods are avoided.

With continued reference to FIGS. 8A through 8D, one or more embodiments provides PFET source/drains 268 that are epitaxially aligned to the single crystalline structure of the vertical stack of the active semiconductor nanosheets 22 (i.e., the channels 22). In one or more embodiments of the present invention, the PFET source/drains 268 are formed with in-situ doping of the epitaxial material during growth by mixing silicon and germanium precursor process gas with dopant gas. In one embodiment, activation of the dopants forms a sharp junction. Dopants for the PFET source/drains 268 include, for example, boron (B) or indium (In), or gallium (Ga).

Turning to FIGS. 9A through 9D, the semiconductor device 100 is illustrated after removing the second portion of the dielectric liner 266 and forming source/drains 270 (i.e., NFET source/drains 270) in the NFET region 11. The NFET source/drains 270 can be formed by depositing a second dielectric liner 272 that covers the PFET source/drains 268, and selectively removing the remaining portion of the first dielectric liner 266 from the source/drain cavities 260 (see FIG. 5A). The NFET source/drains 270 can then be formed in the source/drain cavities 260. As further shown in FIG. 9A, the dielectric sub-walls 202*a* and 202*b* are formed between the NFET source/drains 270*a* and 270*b* of neighboring NFETs, i.e., inside a given NFET source/drain cavity 260*a* and 260*b*. Accordingly, a given dielectric sub-wall 202*a* and 202*b* effectively divides an NFET source/drain 270 into a first NFET sub-source/drain 270*a* (i.e., a first portion 270*a* of the source/drain 270) and a second sub-source/drain 270*b* (i.e., a second portion 270*b* of the source/drain 270).

In one or more embodiments of the invention, the NFET source/drains 270 are formed by epitaxially growing a semiconductor material from the exposed sides of the active semiconductor nanosheets 22 (i.e., channels 22). In one or more embodiments of the present invention, the NFET source/drains 270 are epitaxially aligned to the single crystalline structure of the vertical stack of the active semiconductor nanosheets 22 (i.e., the channels 22). In one or more embodiments of the present invention, the NFET source/drains 270 are formed with in-situ doping of the epitaxial material during growth by mixing a precursor process gas with dopant gas. In one embodiment, activation of the dopants forms a sharp junction. Dopants for the NFET source/drains 270 include, for example, phosphorus (P) or arsenic (As).

Referring now to FIGS. 10A through 10D, the semiconductor device 100 is illustrated following a replacement metal gate (RMG) process. The RMG process can include selectively removing the sacrificial nanosheets 20, which releases the active semiconductor nanosheets 22. Accordingly, the active semiconductor nanosheets 22 can be utilized as channels for a given NFET and PFET. Replacement metal gates 274 are then formed over corresponding channels defined by the active semiconductor nanosheets 22. As used herein, a "channel" refers to the portion of the active semiconductor layers 22 over which the gate 274 is formed, and through which current passes from source to drain in the final device. In one or more embodiments of the invention, an ILD 276 can be deposited on the semiconductor device 100. The ILD 276 can be formed from SiO2, for example, and can cover the gates 274, PFET source/drains 268 and the NFET source/drains 270.

Turning now to FIGS. 11A through 11E, an intermediate semiconductor device 100 is illustrated according to another embodiment of the present invention. In FIGS. 11A through 11E, a dielectric wall 200 is formed in the N-to-P region of the semiconductor device 100. The dielectric wall 200 can have a width (extending between the NFET region 11 and the PFET region 13) ranging, for example, about 10 nm or less. According to a non-limiting embodiment, the dielectric wall 200 is formed by patterning an alternating stack of sacrificial nanosheets 20 and active semiconductor nanosheets 22 to form an wall trench, and then filling the wall trench with a dielectric material. In one or more embodiments, the dielectric wall 200 can be formed by overfilling the wall trench silicon dioxide (SiO2), for example, and then performing an etch back operation that stops on the upper surface of the uppermost sacrificial nanosheet 20. Accordingly, the dielectric wall 200 is formed in the N-to-P region.

Referring to FIGS. 12A through 12E, the semiconductor 100 is illustrated after forming sub-wall trenches 27*a* and 27*b* in the NFET region 11. As further shown in FIGS. 12A and 12B, for example, the sub-wall trenches 27*a* and 27*b* are formed between designated source/drain regions 15 (i.e., NFET source/drain regions) of neighboring NFET regions 11. The sub-wall trench trenches 27*a* and 27*b* can have a width (extending between neighboring NFET nanosheet structures 28) of, for example, 10 nm or less. As described herein, the width of the sub-wall trench trenches 27*a* and 27*b* defines the width of sub-walls subsequently formed in the sub-wall trenches 27*a* and 27*b*.

In one or more non-limiting embodiments of the present invention, a lithography operation can be performed to define the sub-wall trench pattern and a selective RIE can be performed to transfer the sub-wall trench pattern into the alternating sacrificial nanosheets 20 and the active semiconductor nanosheets 22 to form the sub-wall trench trenches 27*a* and 27*b*. The RIE can utilize an etchant chemistry that is selective to the material of the sacrificial nanosheets 20 and the active semiconductor nanosheets 22 so that the dielectric wall 200 is preserved.

In some embodiments of the present invention, the sub-wall trench trenches 27*a* and 27*b* can be formed at the same time as the wall trench 25. The sub-wall trench trenches 27*a* and 27*b* and the wall trench 25 can then be filed with a dielectric material such as, for example, SiO2. A hardmask (not shown) can then be deposited on the semiconductor device 100 and patterned to expose a portion of dielectric material formed in the sub-wall trench trenches 27*a* and 27*b*. A RIE selective to the dielectric wall material (e.g. SiO2) can then be performed to remove the dielectric material and form (i.e., reintroduce) sub-wall trench trenches 27*a* and 27*b*.

Turning now to FIGS. 13A through 13E, the semiconductor device 100 is illustrated after forming semiconductor sub-walls 203*a* and 203*b* in the sub-wall trench trenches 27*a* and 27*b*, respectively. According to a non-limiting embodiment of the invention, the semiconductor sub-walls 203*a* and 203*b* are formed by growing an epitaxial material such as Si, for example, in the sub-wall trenches 27*a* and 27*b*.

In one or more non-limiting embodiments, the semiconductor sub-walls 203*a* and 203*b* can be in-situ doped when growing the nFET epitaxy material as described herein. In one embodiment, the dopants added to the semiconductor sub-walls 203*a* and 203*b* include n-type dopants such as, for example, phosphorus (P), antimony (Sb), and arsenic (As). Accordingly, the amount of nFET epitaxy material can be increased so as to increase the volume of nFET epitaxy. In this manner, the volume of the nFET epitaxy volume can match, or substantially match, the pFET epitaxy volume.

Turning now to FIGS. 15A through 15E, the semiconductor device 100 is illustrated following a replacement metal gate (RMG) process. The RMG process can include selectively removing the sacrificial nanosheets 20, which releases the active semiconductor nanosheets 22. Accordingly, the active semiconductor nanosheets 22 can be utilized as channels for a given NFET and PFET. Replacement metal gates 274 are then formed over corresponding channels defined by the active semiconductor nanosheets 22. As used herein, a "channel" refers to the portion of the active semiconductor layers 22 over which the gate 274 is formed, and through which current passes from source to drain in the final device. In one or more embodiments of the invention, an ILD 276 can be deposited on the semiconductor device 100. The ILD 276 can be formed from SiO2, for example, and can cover the gates 274, PFET source/drains 268 and the NFET source/drains 270.

In one or more embodiments of the invention, the PFET source/drains 268 and the NFET source/drains 270 are formed by epitaxially growing a semiconductor material from the exposed sides of the active semiconductor nanosheets 22 (i.e., channels 22). In one or more embodiments of the present invention, the PFET source/drains 268 and the NFET source/drains 270 are epitaxially aligned to the single crystalline structure of the vertical stack of the active semiconductor nanosheets 22 (i.e., the channels 22).

In one or more embodiments of the present invention, the PFET source/drains 268 are grown with in-situ doping of the epitaxial material during growth by mixing silicon and germanium precursor process gas with dopant gas. Dopants for the PFET source/drains 268 include, for example, boron (B) or indium (In), or gallium (Ga). Similarly, the NFET source/drains 270 are grown with in-situ doping of the epitaxial material during growth by mixing a precursor process gas with dopant gas. Dopants for the NFET source/drains 270 include, for example, phosphorus (P) or arsenic (As).

As further shown in FIGS. 15A and 15B, for example, the semiconductor sub-walls 203*a* and 203*b* extend through the NFET source/drain 270 of neighboring NFETs. Accordingly, a given semiconductor sub-wall 203*a* and 203*b* effectively divides or separates an NFET source/drain 270 into a first NFET sub-source/drain 270*a* (i.e., a first portion 270*a* of the NFET source/drain 270) and a second sub-source/drain 270*b* (i.e., a second portion 270*b* of the NFET source/drain 270).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming a t-shaped backbone in a stack of nanosheets, the t-shaped backbone including a dielectric wall separating the stack of nanosheets into a first-type nanosheet structure and a second-type nanosheet structure, and including a sub-wall extending into a second-type source/drain region of the second-type nanosheet structure;

forming a first source/drain cavity in a first-type source/drain region of the first-type nanosheet structure and a second source/drain cavity in the second-type nanosheet structure, the sub-wall dividing the second source/drain cavity into a first source/drain sub-cavity and a second source/drain sub-cavity;

performing a conformal deposition process that completely fills the first source/drain sub-cavity and the second source/drain sub-cavity with a dielectric material without completely filing the first source/drain cavity with the dielectric material;

removing a first portion of the dielectric material from the first source/drain cavity, and forming a first-type source/drain in the first source/drain cavity while a second portion of the dielectric material prevents formation of the first-type source/drain in the second source/drain cavity; and removing the second portion of the dielectric material and forming a second-type source/drain in the first source/drain sub-cavity and the second source/drain sub-cavity.

2. The method of claim 1, wherein forming the t-shaped backbone comprises:

forming a first trench in the stack of nanosheets to define a first-type transistor region designated to include the first-type nanosheet structure and a second-type transistor region designated to include the second-type nanosheet structure;

forming a second trench extending from the first trench into the second-type source/drain region; and filling the first trench and the second trench with at least one material that forms the t-shaped backbone.

3. The method of claim 2, further comprising:

forming a first gate that wraps around the first-type nanosheet structure to define a first-type transistor; and forming a second gate that wraps around the second-type nanosheet structure to define a second-type transistor.

4. The method of claim 3, wherein:

the first-type nanosheet structure, the first-type source/drain region, and the first-type source/drain corresponds to a p-type field effect transistor (PFET); and the second-type nanosheet structure, the second-type source/drain region, and the second-type source/drain corresponds to an n-type field effect transistor (NFET).

5. The method of claim 3, wherein:

the first-type nanosheet structure, the first-type source/drain region, and the first-type source/drain corresponds to an n-type field effect transistor (NFET); and the second-type nanosheet structure, the second-type source/drain region, and the second-type source/drain corresponds to a p-type field effect transistor (PFET).

6. The method of claim 2, wherein the at least one material comprises the dielectric material.

7. The method of claim 6, wherein the dielectric material comprises silicon dioxide (SiO2).

8. The method of claim 3, wherein filling the first trench and the second trench with the at least one material comprises:

filling the first trench with the dielectric material; and filling the second trench with a semiconductor material.

9. The method of claim 8, wherein the dielectric material comprises silicon dioxide (SiO2) and the semiconductor material comprises silicon germanium (SiGe) or silicon, depending if pFET or nFET.

10. A method of forming a forksheet field effect transistor (FET), the method comprising:

forming a stack of nanosheets on a substrate;

forming a t-shaped backbone including a wall and a sub-wall extending from the wall, the wall separating the stack of nanosheets into a first-type nanosheet structure and a second-type nanosheet structure;

patterning the first-type nanosheet structure to form at least two first-type nanosheet fins separated from one another by a first source/drain, and patterning the second-type nanosheet structure to form at least two second-type nanosheet fins separated from one another by a second-type source/drain; and forming a first gate and a second gate that wrap around the at least two first-type nanosheet fins, respectively, to form a first-type transistor, and forming a third gate and a fourth gate that wrap around the at least two second-type nanosheet fins, respectively, to form a second-type transistor, wherein the sub-wall extends into the second-type source/drain.

11. The method of claim 10, wherein the sub-wall separates a first portion of the second-type source/drain from a second portion of the second-type source/drain.

12. The method of claim 11, wherein the wall separates the first-type transistor from the second-type transistor.

* * * * *